(12) United States Patent
Jiang et al.

(10) Patent No.: US 12,484,229 B2
(45) Date of Patent: Nov. 25, 2025

(54) MEMORY DEVICE AND METHOD OF FORMING THE SAME

(71) Applicant: Taiwan Semiconductor Manufacturing Company, Ltd., Hsinchu (TW)

(72) Inventors: Yu-Wei Jiang, Hsinchu (TW); Pin-Cheng Hsu, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 399 days.

(21) Appl. No.: 18/152,751

(22) Filed: Jan. 10, 2023

(65) Prior Publication Data

US 2024/0081078 A1  Mar. 7, 2024

Related U.S. Application Data

(60) Provisional application No. 63/404,178, filed on Sep. 6, 2022.

(51) Int. Cl.
*H10B 51/20* (2023.01)
*H10B 51/10* (2023.01)
*H10B 51/30* (2023.01)

(52) U.S. Cl.
CPC .............. *H10B 51/20* (2023.02); *H10B 51/10* (2023.02); *H10B 51/30* (2023.02)

(58) Field of Classification Search
CPC .......... H10B 51/20; H10B 51/10; H10B 51/30
See application file for complete search history.

(56) References Cited

U.S. PATENT DOCUMENTS

| | | | |
|---|---|---|---|
| 11,871,588 B2 * | 1/2024 | Lee | H10N 50/01 |
| 2021/0391354 A1 * | 12/2021 | Sun | H10B 43/27 |
| 2022/0392920 A1 * | 12/2022 | Wu | H10D 30/025 |
| 2023/0038021 A1 * | 2/2023 | Lin | H10B 43/10 |

* cited by examiner

*Primary Examiner* — Richard A Booth
(74) *Attorney, Agent, or Firm* — JCIPRNET

(57) ABSTRACT

A memory device includes a multi-layer stack, a channel layer, a memory material layer and at least three conductive pillars. The multi-layer stack is disposed on a substrate and includes a plurality of conductive layers and a plurality of dielectric layers stacked alternately. The channel layer and memory material layer penetrate through the plurality of conductive layers and the plurality of dielectric layers. The at least three conductive pillars are surrounded by the channel layer and the memory material layer, wherein the at least three conductive pillars are electrically connected to conductive layers respectively. The at least three conductive pillars includes a first, a second and a third conductive pillars disposed between the first conductive pillar and the second conductive pillar. A third width of the third conductive pillar is smaller than a first width of the first conductive pillar and a second width of the second conductive pillar.

20 Claims, 33 Drawing Sheets

MEMORY DEVICE AND METHOD OF FORMING THE SAME

CROSS-REFERENCE TO RELATED APPLICATION

This application claims the priority benefit of U.S. provisional application Ser. No. 63/404,178, filed on Sep. 6, 2022. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
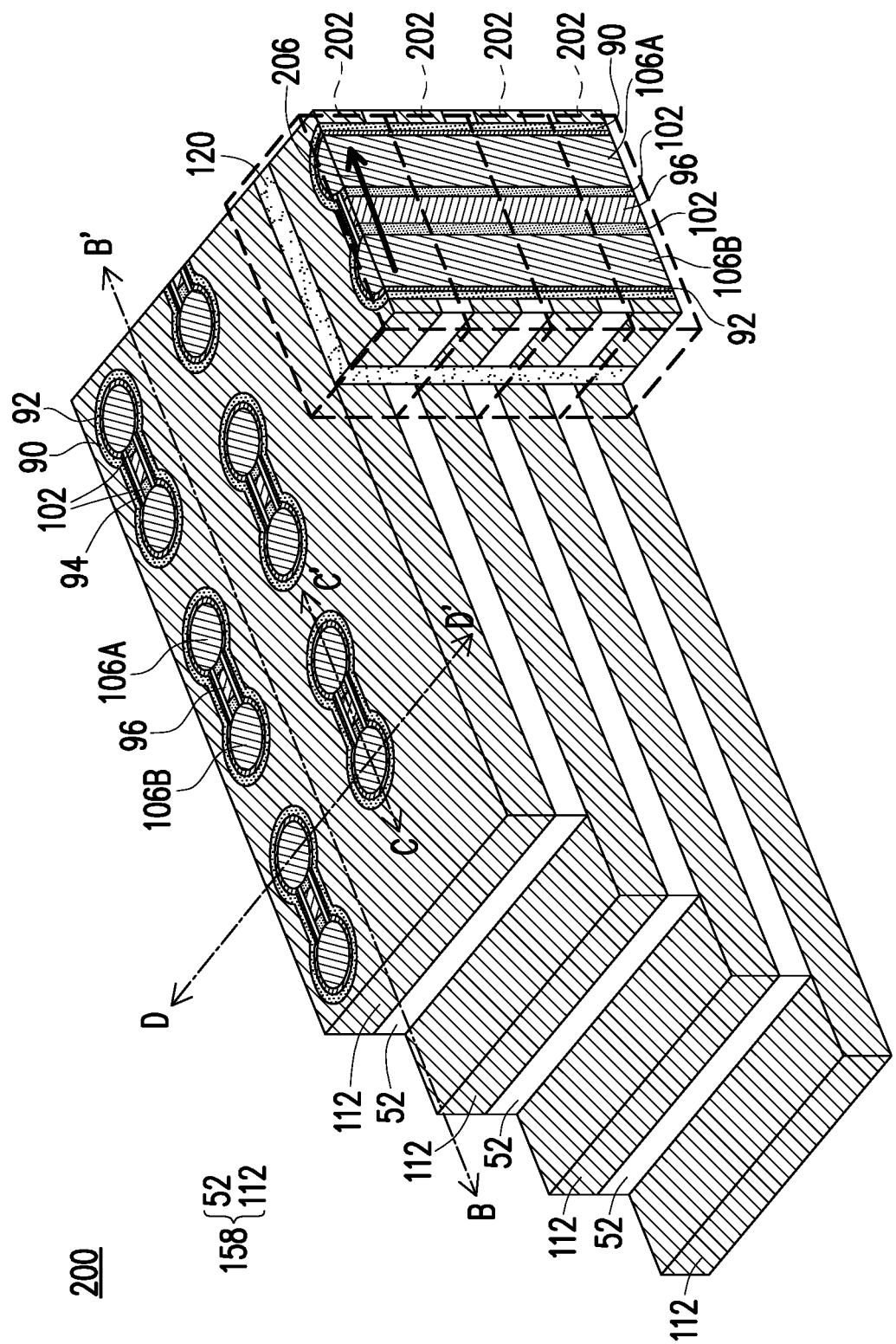
FIGS. 1A, 1B, and 1C illustrate a simplified perspective view, a circuit diagram, and a top down view of a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, a source line region acting as a second source/drain electrode, a ferroelectric material acting as a gate dielectric, and an oxide semiconductor (OS) acting as a channel region. In some embodiments, each memory cell is regarded as a thin film transistor (TFT).

According to various embodiments, a three-dimensional memory array is formed of programmable thin film transistors (TFTs) having assist gates. The memory material layers of the TFTs are disposed between the assist gates and the word lines for the TFTs. During a write operation (e.g., an erase or programming operation) for a TFT, a biasing voltage is applied to the assist gate of the TFT, thereby increasing the write voltage applied across the memory material layer of the TFT. Increasing the write voltage applied across the memory material layer during the write operation can help increase the speed and accuracy of the write operation. The performance of the memory array may thus be improved.

Figure 1B:
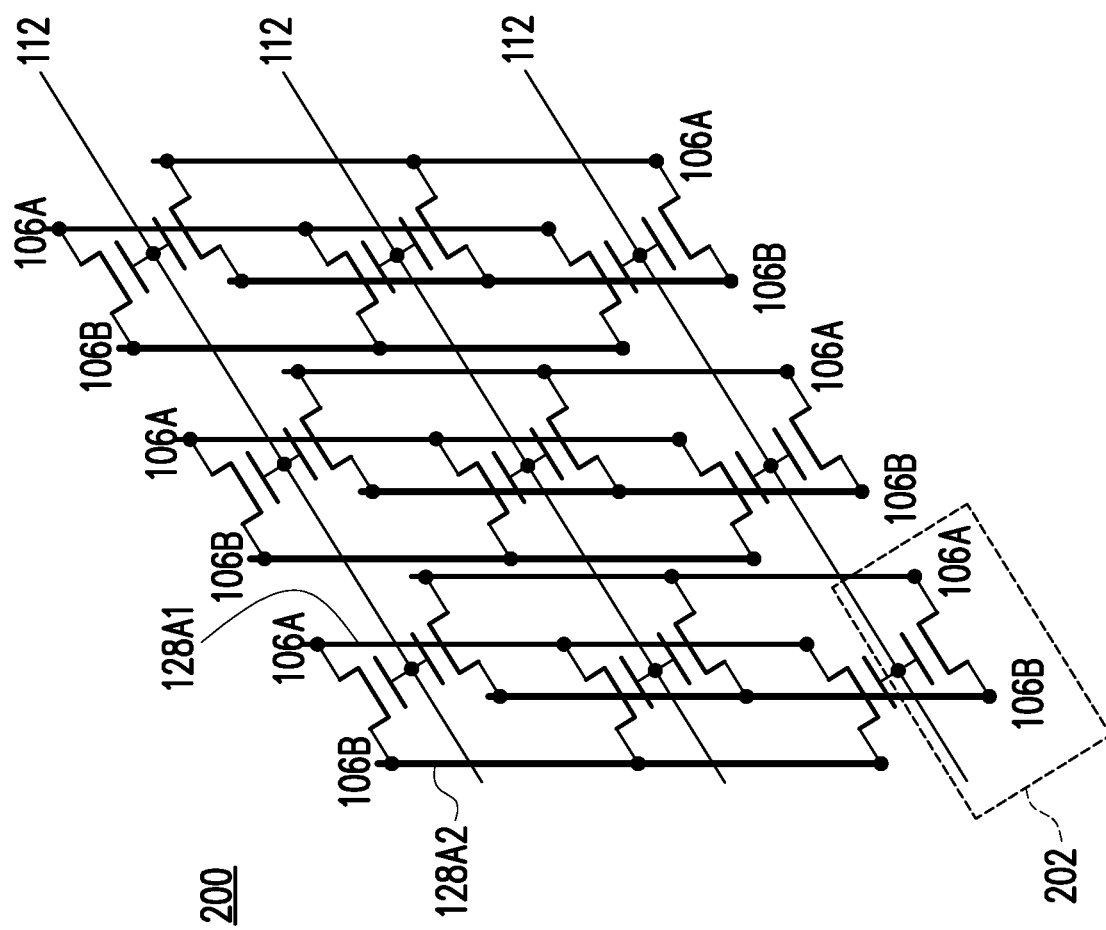
Figure 1C:
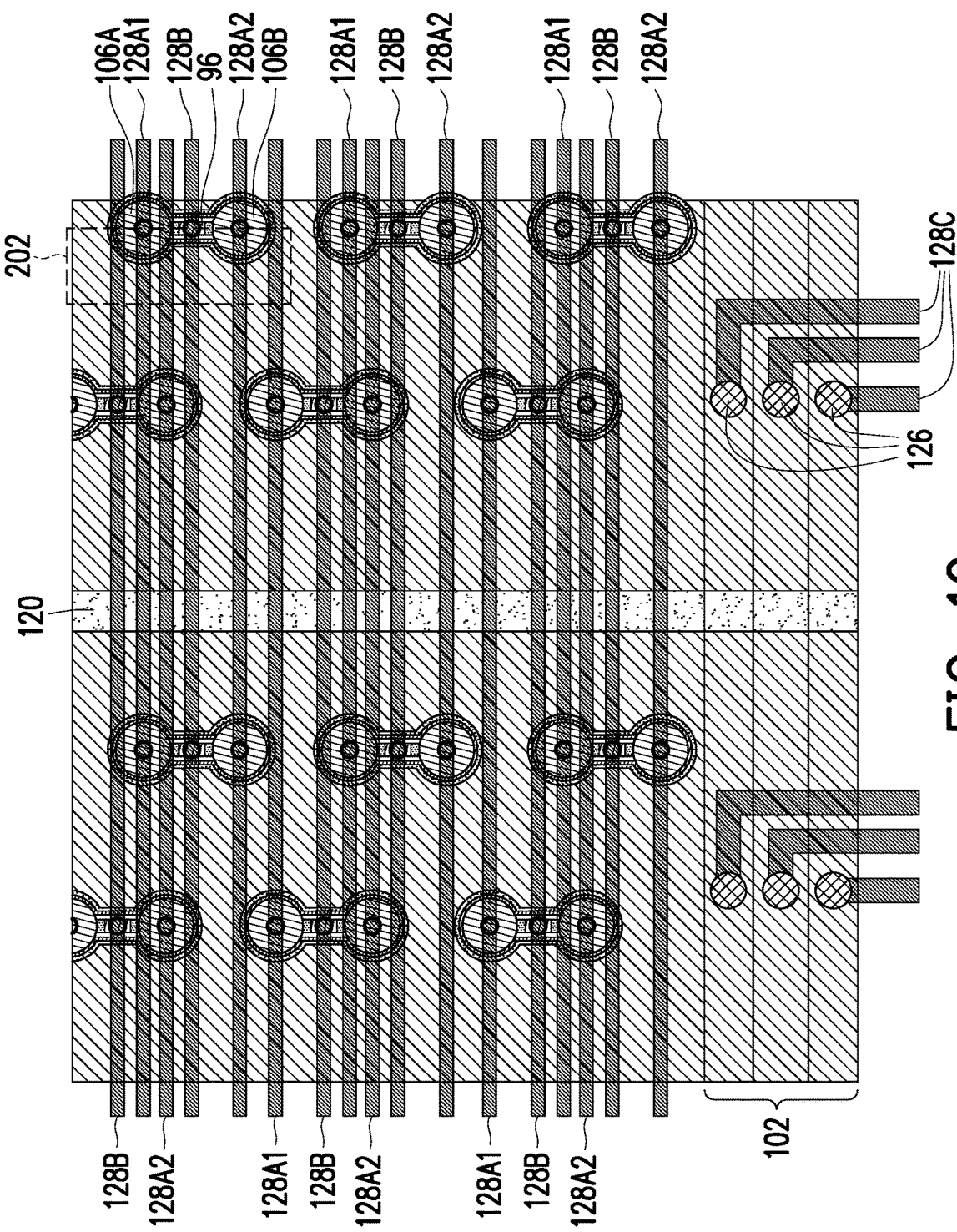

FIGS. 1A, 1B, and 1C illustrate examples of a memory array according to some embodiments. FIG. 1A illustrates an example of a portion of a simplified memory device 200 in a partial three-dimensional view. FIG. 1B illustrates a circuit diagram of the memory device 200. FIG. 1C illustrates a top down view of the memory device 200 in accordance with some embodiments. The memory device 200 includes a plurality of memory cells 202, which may be arranged in a grid of rows and columns. The memory cells 202 may be further stacked vertically to provide a three dimensional memory array, thereby increasing device density. The memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory device 200 is a flash memory array, such as a NOR flash memory array, or the like. In some embodiments, a gate of each memory cell 202 is electrically coupled to a respective word line (e.g., conductive layer 112), a first source/drain region (e.g., conductive pillar 106A) of each memory cell 202 is electrically coupled to a respective bit line (e.g., conductive line 128A1), a second source/drain region (e.g., conductive pillar 106B) of each memory cell 202 is electrically coupled to a respective source line (e.g., conductive line 128A2), and an assist gate 96 of each memory cell 202 is electrically coupled to a respective conductive line (e.g., conductive line 128B).

The memory device 200 includes a plurality of vertically stacked conductive layers 112 (e.g., word lines) with dielectric layers 52 disposed between adjacent ones of the conductive layers 112. The conductive layers 112 extend in a direction parallel to a major surface of an underlying substrate (not explicitly illustrated in FIGS. 1A and 1C). The conductive layers 112 may have a staircase configuration such that lower conductive layers 112 are longer than and extend laterally past endpoints of upper conductive layers 112. For example, in FIG. 1A, multiple, stacked layers of conductive layers 112 are illustrated with topmost conductive layers 112 being the shortest and bottommost conductive layers 112 being the longest. Respective lengths of the conductive layers 112 may increase in a direction towards the underlying substrate. In this manner, a portion of each of the conductive layers 112 may be accessible from above the memory device 200, and conductive contacts may be made to exposed portions of the conductive layers 112, respectively.

The memory device 200 further includes conductive pillars 106A (e.g., electrically connected to first conductive lines), conductive pillars 96 (e.g., electrically connected to second conductive lines) and conductive pillars 106B (e.g., electrically connected to first conductive lines) arranged alternately. The conductive pillars 96 are disposed between the conductive pillars 106A and the conductive pillars 106B. The conductive pillars 106A, 106B and 96 may each extend in a direction perpendicular to the conductive layers 112. A dielectric pillar 102 is disposed between and isolates adjacent ones of the conductive pillars 106A, 106B and the conductive pillars 96. The conductive pillars 96 are served as assist gates.

In some embodiments, the conductive pillars 106A and are electrically connected to source lines, and the conductive pillars 106B are electrically connected to bit lines. In alternative embodiments, the conductive pillars 106A are electrically connected to bit lines, and the and the conductive pillars 106B are electrically connected to source lines.

Sets of the conductive pillars 106A, 106B and 96 along with an intersecting conductive layer 112 define boundaries of each memory cell 202, and the dielectric layer 120 is disposed between the adjacent conductive layers 112 (also referred to as common conductive layers 112). Although FIG. 1A illustrates a particular placement of the conductive pillars 106A, 106B relative the conductive pillars 96, it should be appreciated that the placement of the conductive pillars 106A, 106B and 96 may be exchanged in other embodiments.

In some embodiments, the memory device 200 include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive layer 112, a region of the channel layer 92 that intersects the conductive layer 112 allows current to flow from the conductive pillars 106A to the conductive pillars 106B (e.g., in the direction indicated by arrow 206). In some embodiments, the channel layer 92 includes zinc oxide (ZnO), indium tungsten oxide (InWO, IWO), indium gallium zinc oxide (InGaZnO, IGZO), indium zinc oxide (InZnO), indium tin oxide (ITO), combinations thereof, or the like.

In some embodiments, a gate dielectric layer 94 is disposed between the conductive pillars 96 and the channel layer 92. In some embodiments, the gate dielectric layer 96 includes high-k material such as $AlO_x$, $HfO_x$, $ZrO_x$, $TiO_x$, or the like. In some other embodiments, the gate dielectric layer 94 includes semiconductor materials such as Si, Ge or the like. In alternative embodiments, the gate dielectric layer 94 includes 2d semiconductor such as $MoS_2$.

A memory material layer 90 is disposed between the channel layer 92 and each of the conductive layers 112 and the dielectric layers 52. In some embodiments, the memory material layer 90 includes a ferroelectric material, such as lead zirconium titanate ($Pb[Zr_3Ti]O_3$, PZT), a hafnium oxide (HfOx), hafnium zirconium oxide (HZrOx), aluminum scandium nitride (AlScN), silicon-doped hafnium oxide, or the like. In such embodiments, the memory device 200 is also referred to as a ferroelectric memory device. In alternative embodiments, the memory material layer 90 include different types of memory materials. For example, the memory material layer 90 includes a non-ferroelectric material, such as a multilayer memory structure including a layer of SiNx between two SiOx layers (e.g., an ONO structure).

The memory material layer 90 may be polarized in one of two different directions, and the polarization direction may be changed by applying an appropriate differential voltage across the memory material layer 90 and generating an appropriate electric field. The polarization may be relatively localized (e.g., generally contained within each boundaries of the memory cells 202), and a continuous region of the memory material layer 90 may extend across a plurality of memory cells 202. Depending on a polarization direction of a particular region of the memory material layer 90, a threshold voltage of a corresponding memory cell 202 varies, and a digital value (e.g., 0 or 1) can be stored. For example, when a region of the memory material layer 90 has a first electrical polarization direction, the corresponding memory cell 202 may have a relatively low threshold voltage, and when the region of the memory material layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory material layer 90 corresponding to the memory cell 202. In some embodiments, the write voltage is applied, for example, by applying appropriate voltages to a corresponding conductive layer 112 (e.g., the word line) and the corresponding conductive pillars 106A and 106B (e.g., the bit line/source line). By applying the write voltage across the portion of the memory material layer 90, a polarization direction of the region of the memory material layer 90 may be changed. As a result, the corresponding threshold voltage of the corresponding memory cell 202 may also be switched from a low threshold voltage to a high threshold voltage or vice versa, and a digital value may be stored in the memory cell 202. Because the conductive layers 112 intersect the conductive pillars 106A, 106B and 96, individual memory cells 202 may be selected for the write operation.

To perform a read operation on the memory cell 202 in such embodiments, a read voltage (a voltage between the low and high threshold voltages) is applied to the corresponding conductive layer 112 (e.g., the word line). Depending on the polarization direction of the corresponding region of the memory material layer 90, the memory cell 202 may or may not be turned on. As a result, the conductive pillar 106B may or may not be discharged through the conductive pillar 106A (e.g., a source line that is coupled to ground), and the digital value stored in the memory cell 202 can be determined. Because the conductive layers 112 intersect the conductive pillars 106A, 106B and 96, individual memory cells 202 may be selected for the read operation.

Applying the write voltage during a write operation for a memory cell 202 also includes applying a biasing voltage to the assist gate 96 corresponding to the memory cell 202. Applying the biasing voltage to the assist gate 96 increasing the write voltage applied across the portion of the memory material layer 90 corresponding to the memory cell 202. Increasing the write voltage applied during the write operation can help increase the speed and accuracy of the write operation. Further, because a biasing voltage is applied, the voltages applied to the word line 112, the conductive pillars 106A and 106B (e.g., the bit line/source line) during the write operation may be decreased, reducing complexity of the row decoder and/or the column decoder for the memory array. The assist gates are not used during read operations, and can be left floating during read operations.

FIG. 1A further illustrates reference cross-sections of the memory device 200 that are used in later figures. Cross-section B-B' is along a longitudinal axis of conductive layers 112 and in a direction, for example, parallel to the direction of current flow of the memory cells 202. Cross-section C-C' is parallel to cross-section B-B' and extends through the conductive pillars 106A, the conductive pillars 96 and the conductive pillars 106B. Cross-section D-D' is perpendicular to cross-section B-B' and extends through the conductive pillars 106A and the conductive pillars 106B. Subsequent figures refer to these reference cross-sections for clarity.

Figure 2:
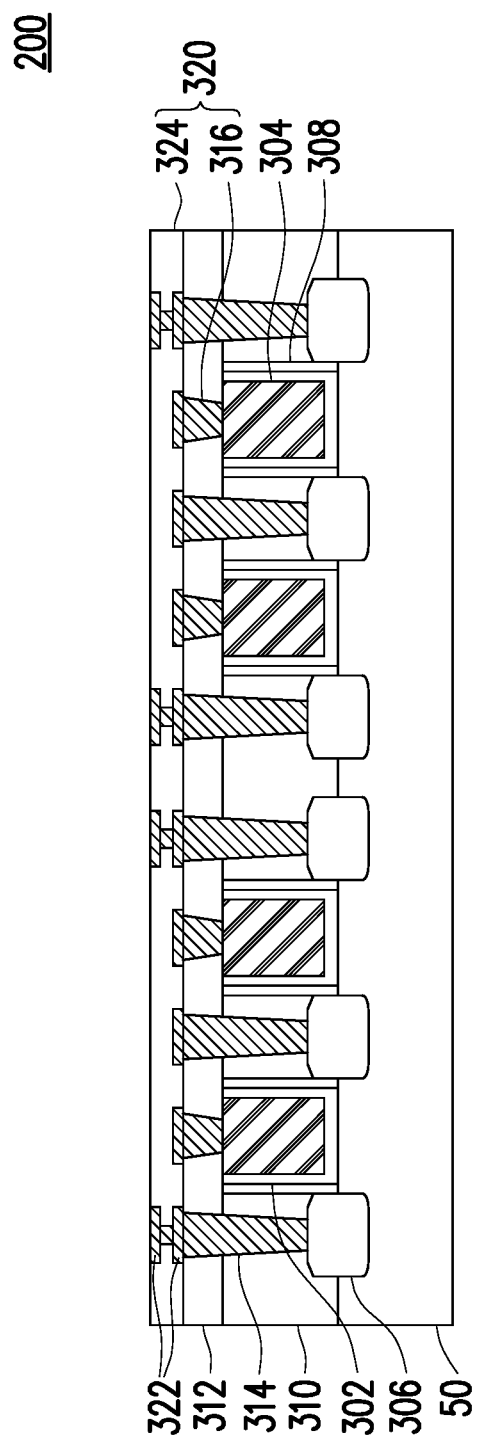
FIGS. 2, 3, 4, 5, 6, 7, 8, 9, 10, 11, 12, 13A-13C, 14A-14C, 15A-15C, 16A-16C, 17A-17C, 18A-18C, 19A-19C, 20A-20C, 21A-21C, 22A-22C, 23A-23C, 24A-24C and 25A-25D illustrate varying views of manufacturing a memory device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
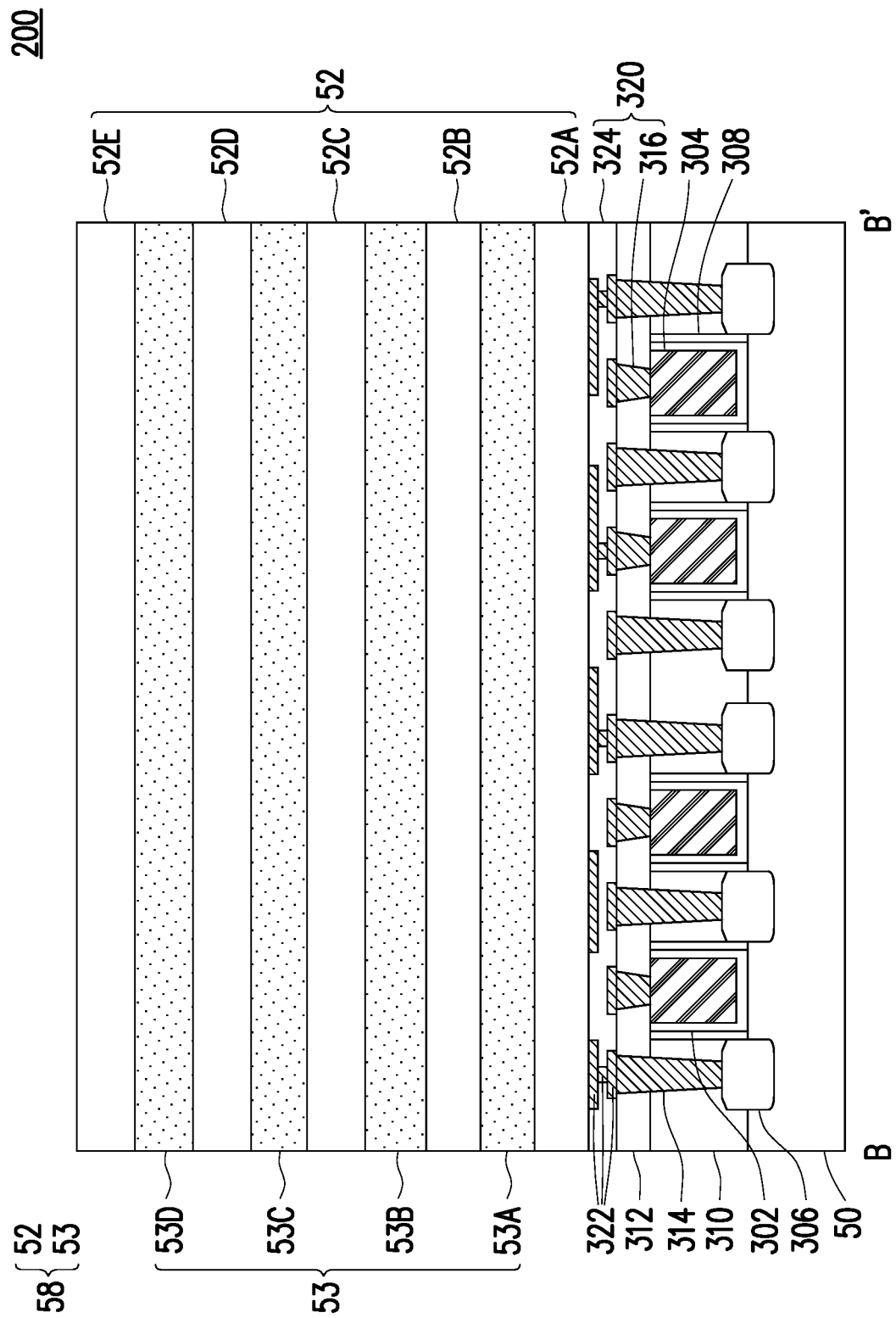

In FIG. 3, a multi-layer stack 58 is formed over the structure of FIG. 2. The substrate 50, the transistors, the ILDs 310 and 312, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulating layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory device 200 (see FIGS. 1A and 1B). In some embodiments, one or more interconnect layers including conductive features in insulating layers (e.g., low-k dielectric layers) are disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive layers 112 (e.g., word lines or conductive lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory device 200, in accordance with some embodiments. FIGS. 4 through 12 are illustrated along reference cross-section B-B' illustrated in FIG. 1A.

Figure 4:
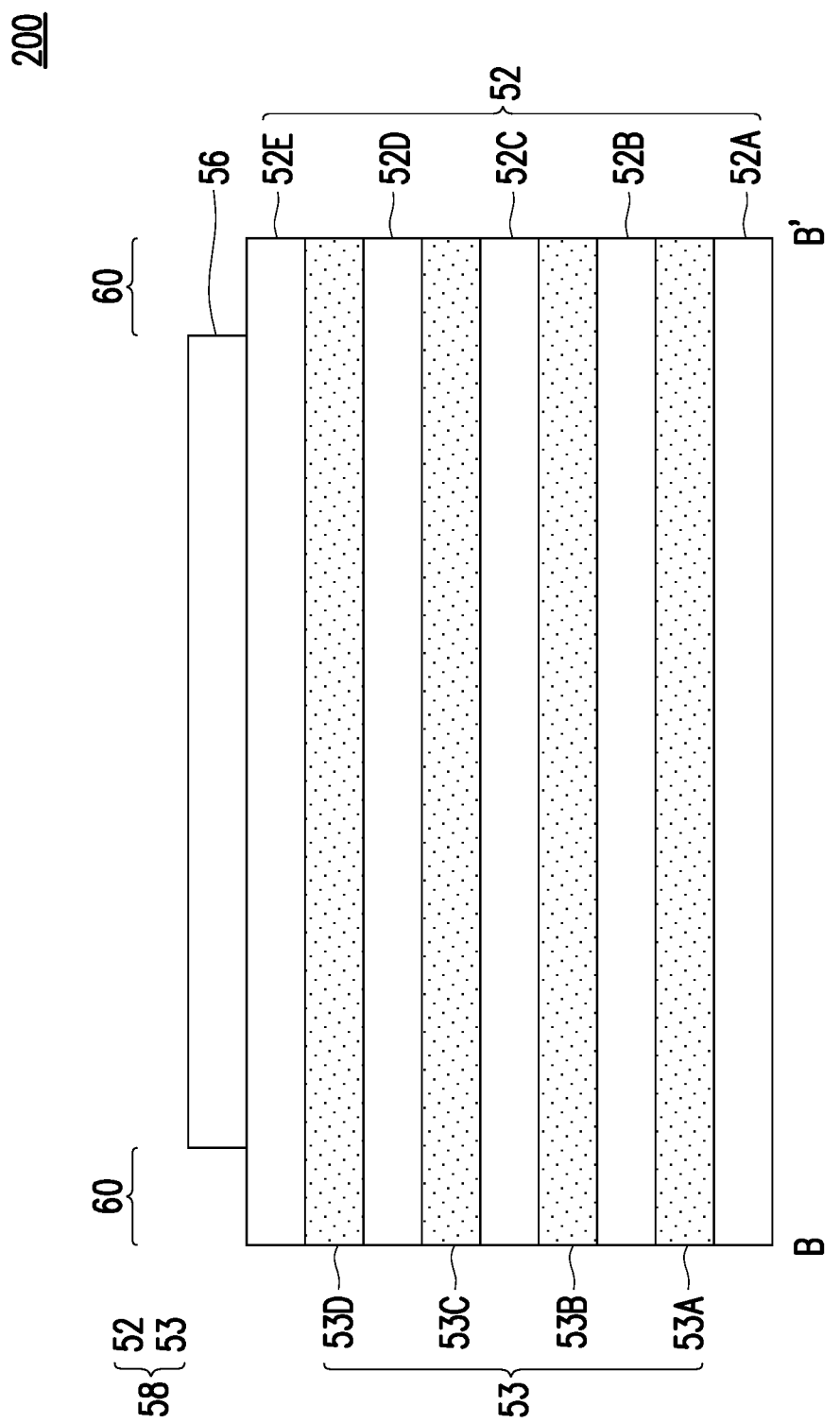

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) is exposed in the regions 60.

Figure 5:
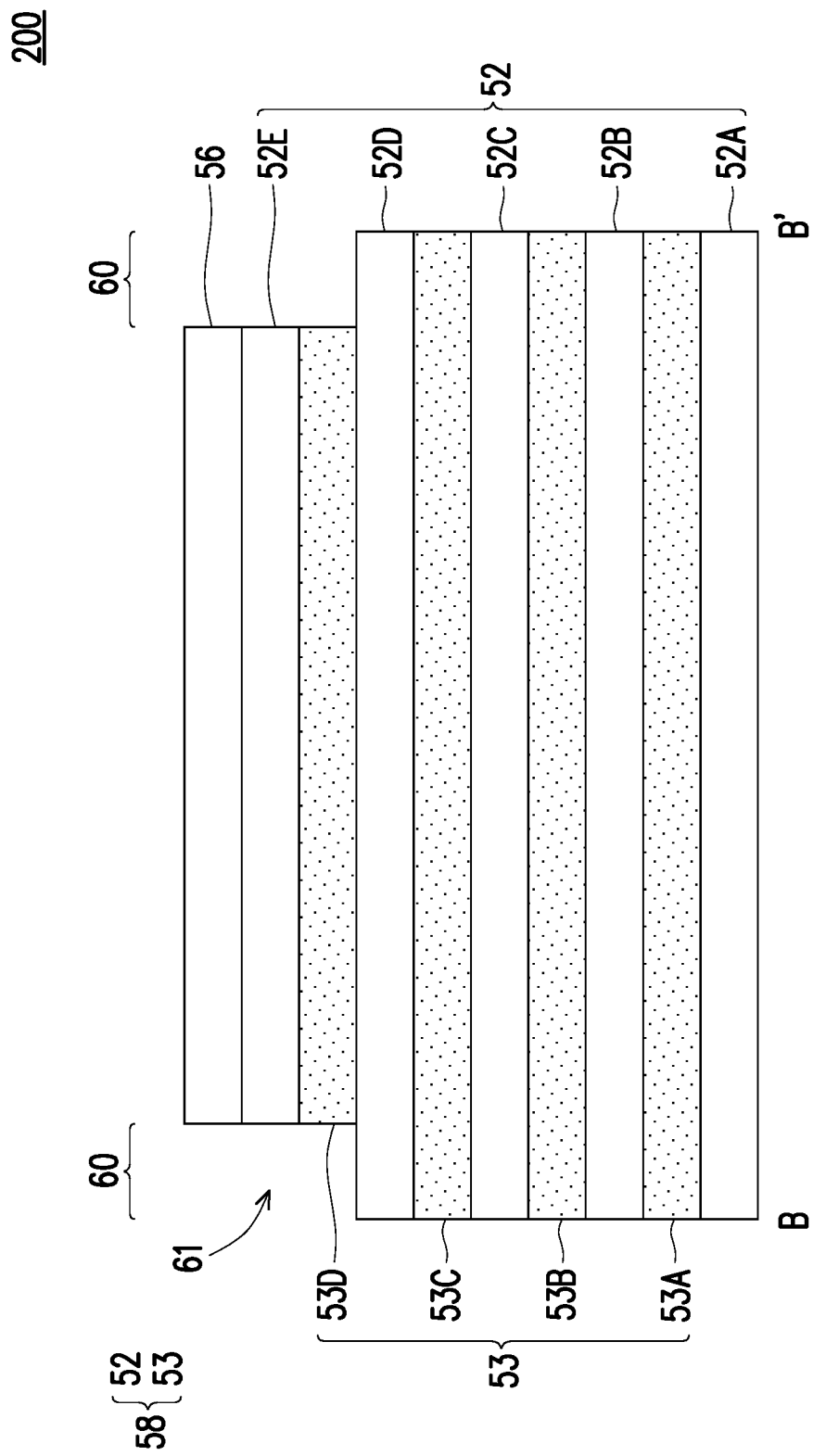

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
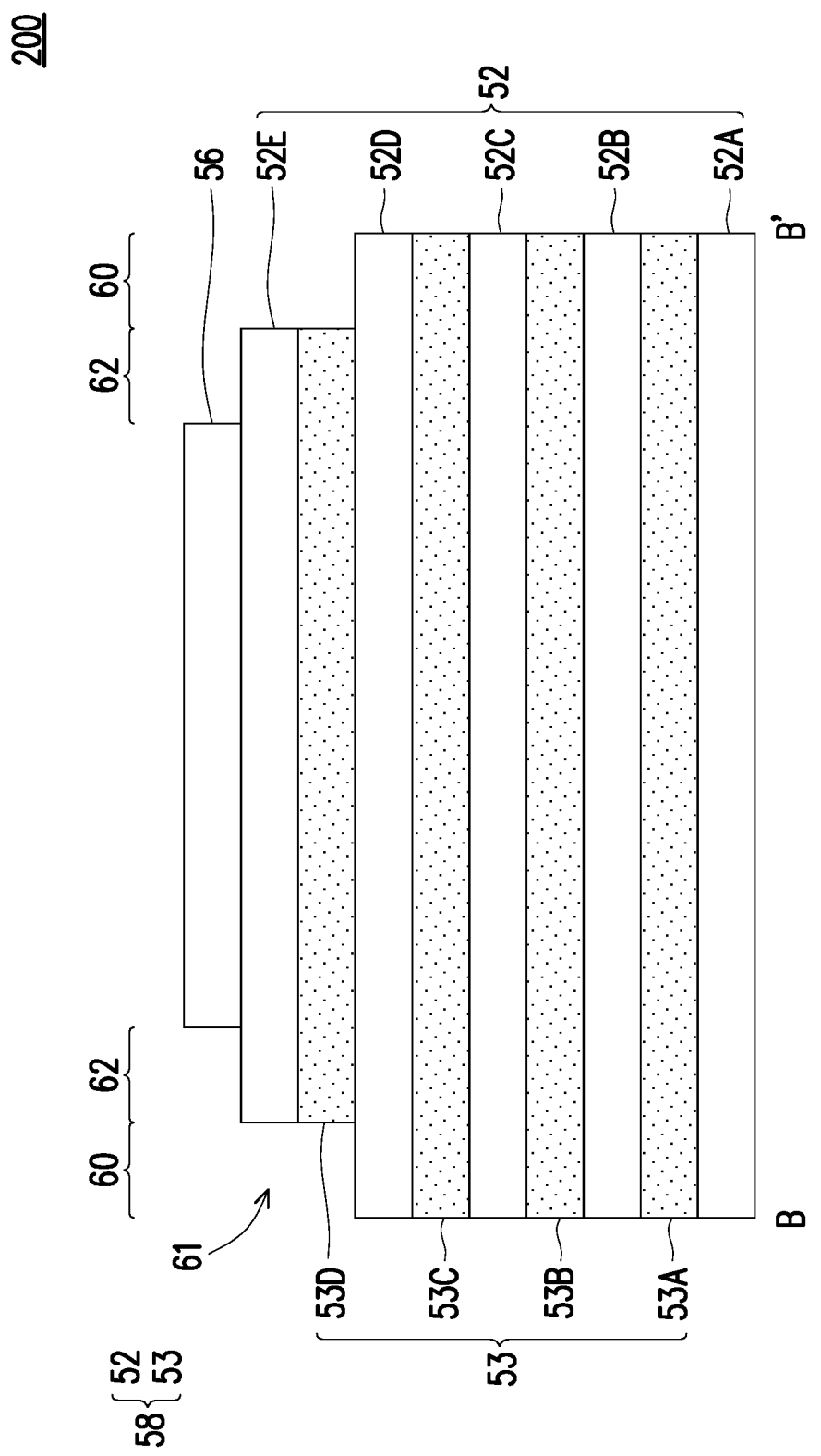

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
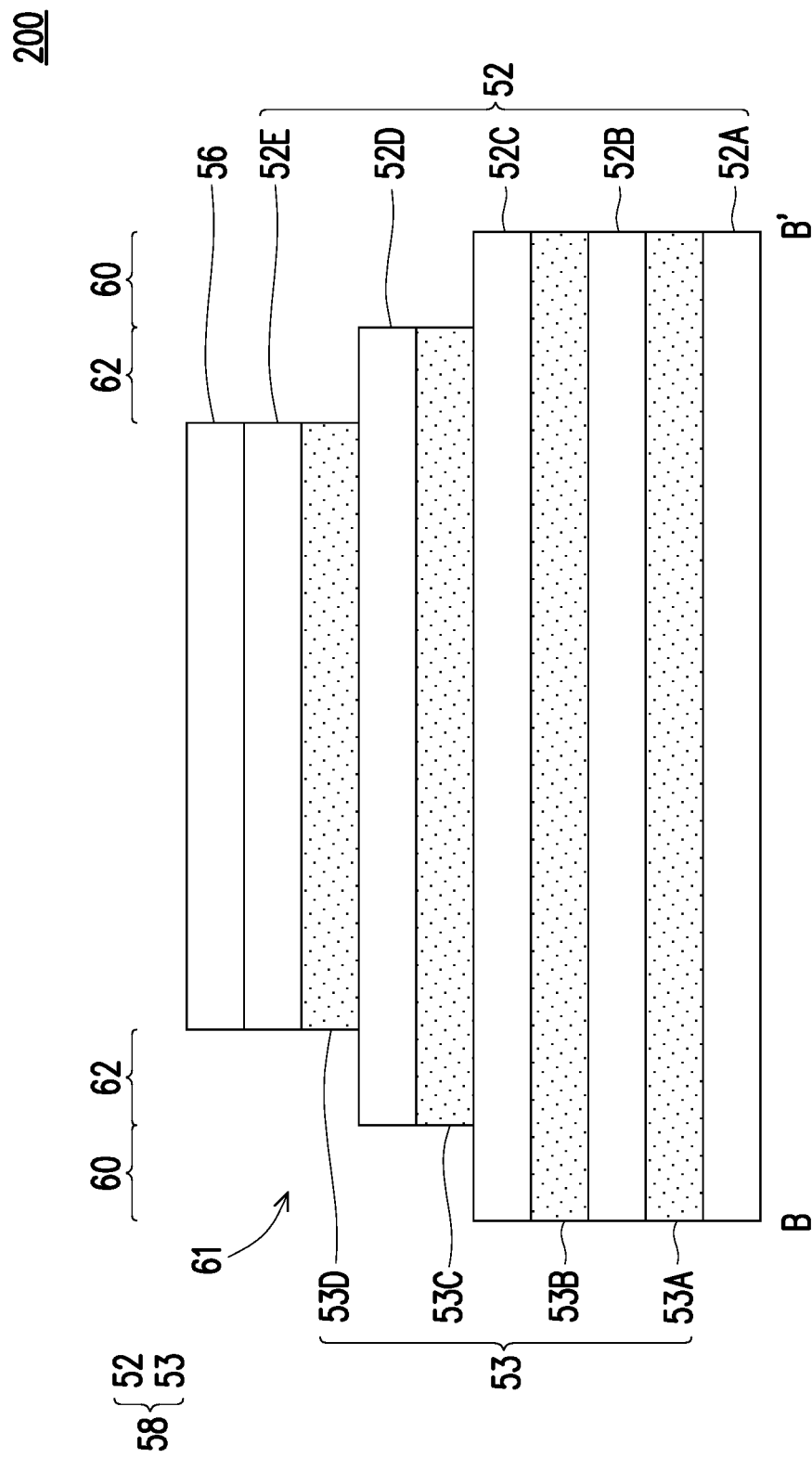

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
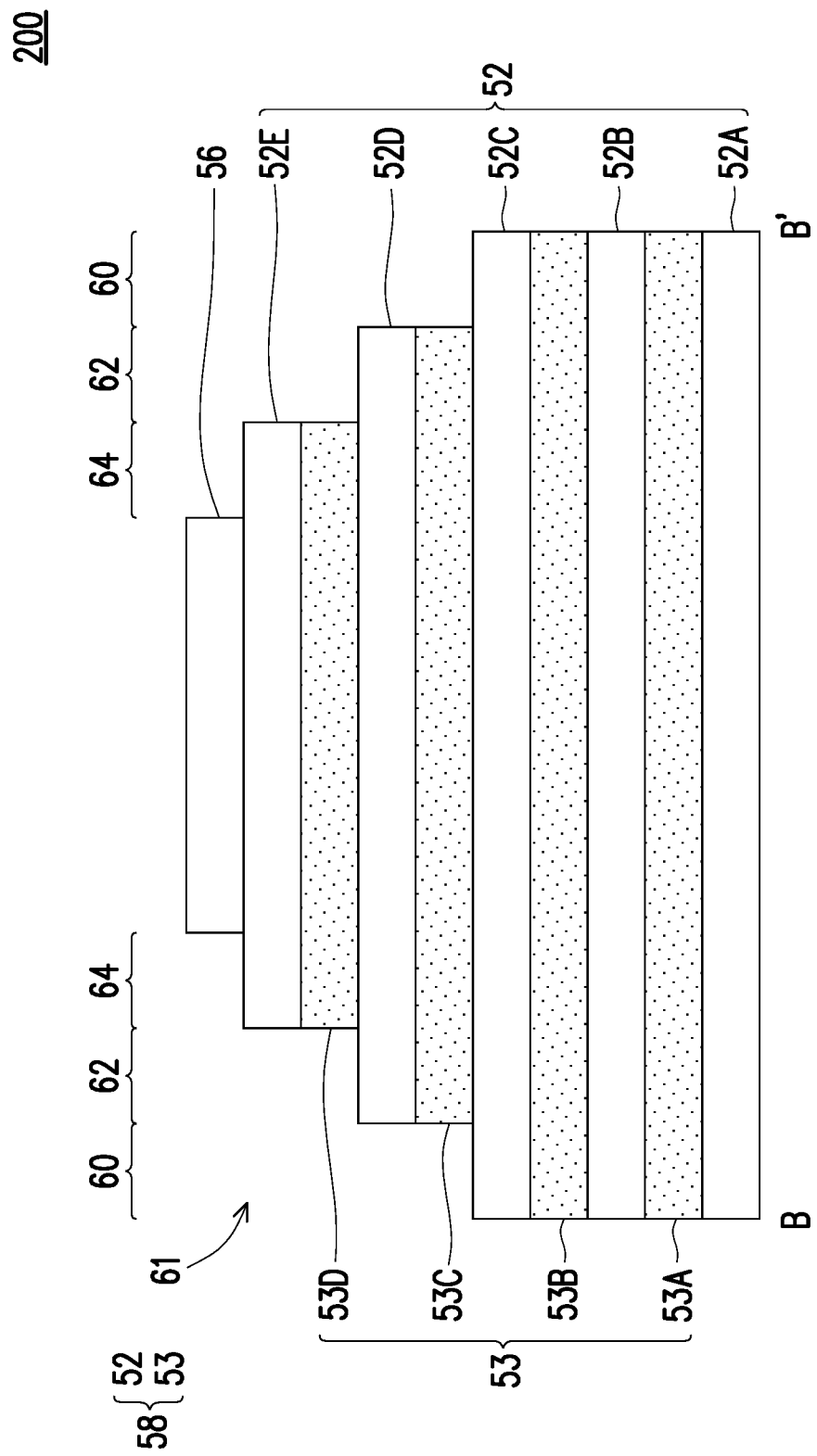

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C are exposed in the regions 60; top surfaces of the dielectric layer 52D are exposed in the regions 62; and top surfaces of the dielectric layer 52E are exposed in the regions 64.

Figure 9:
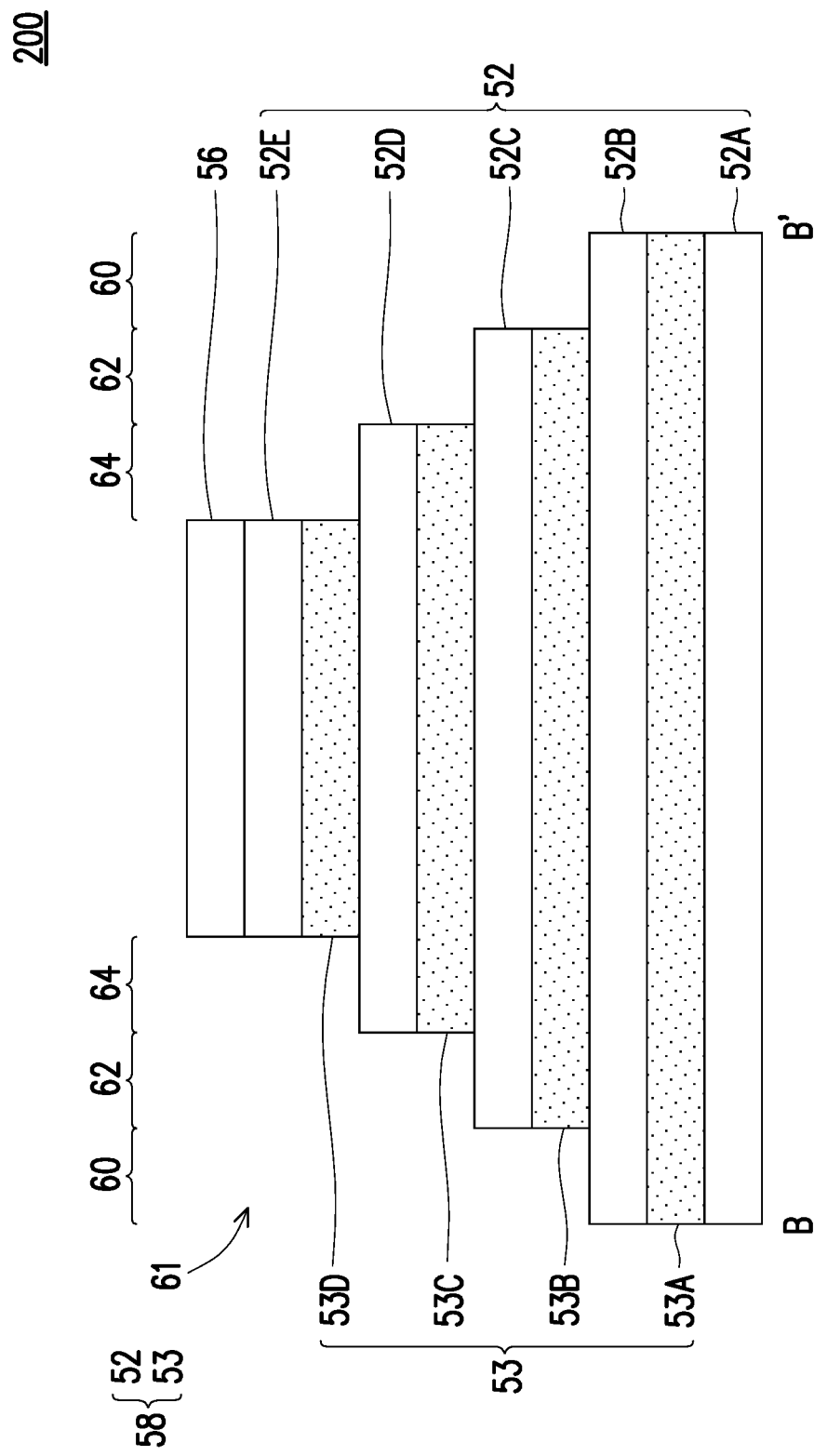

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
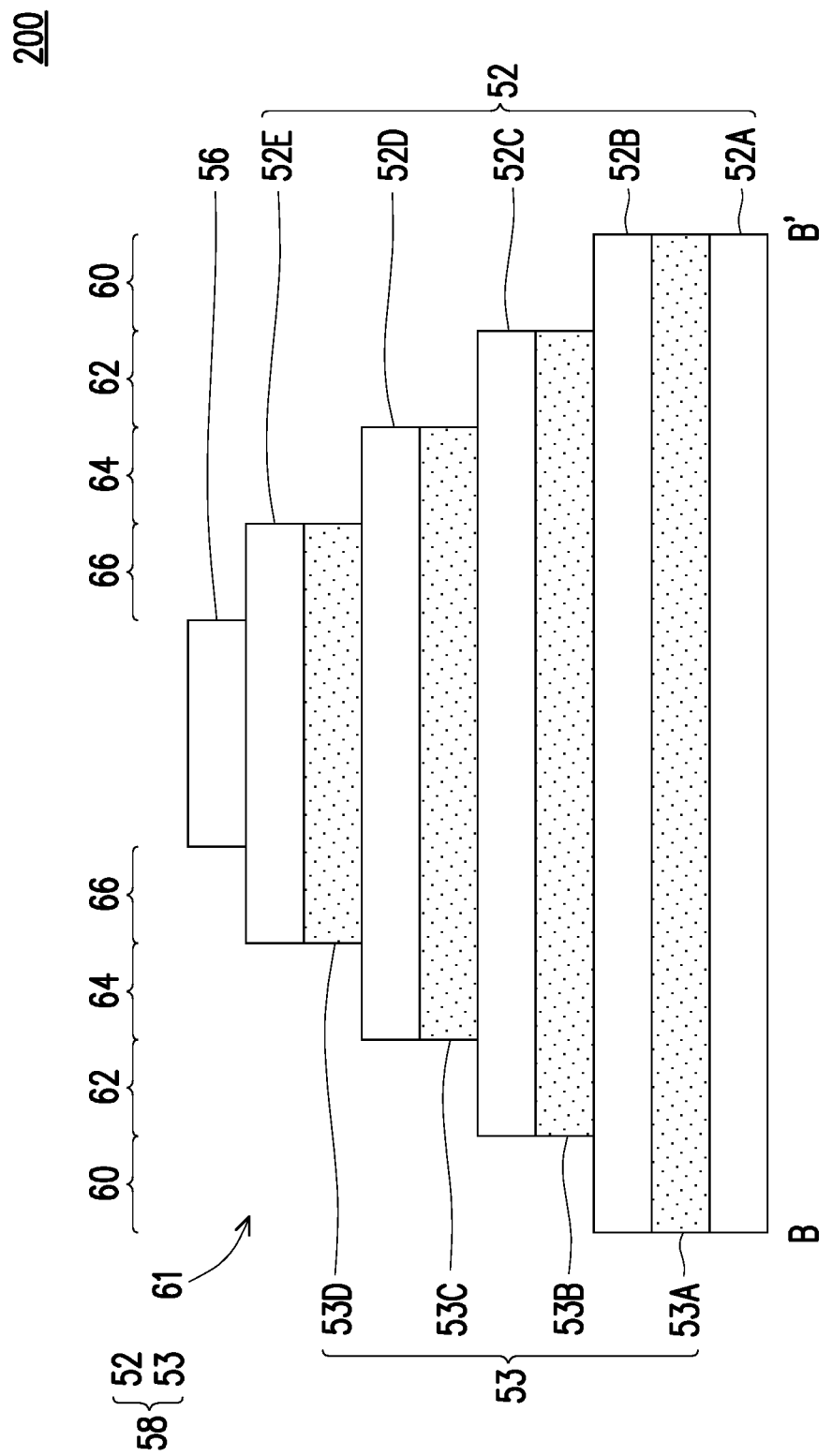

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B are exposed in the regions 60; top surfaces of the dielectric layer 52C are exposed in the regions 62; and top surfaces of the dielectric layer 52D are exposed in the regions 64; and top surfaces of the dielectric layer 52E are exposed in the regions 66.

Figure 11:
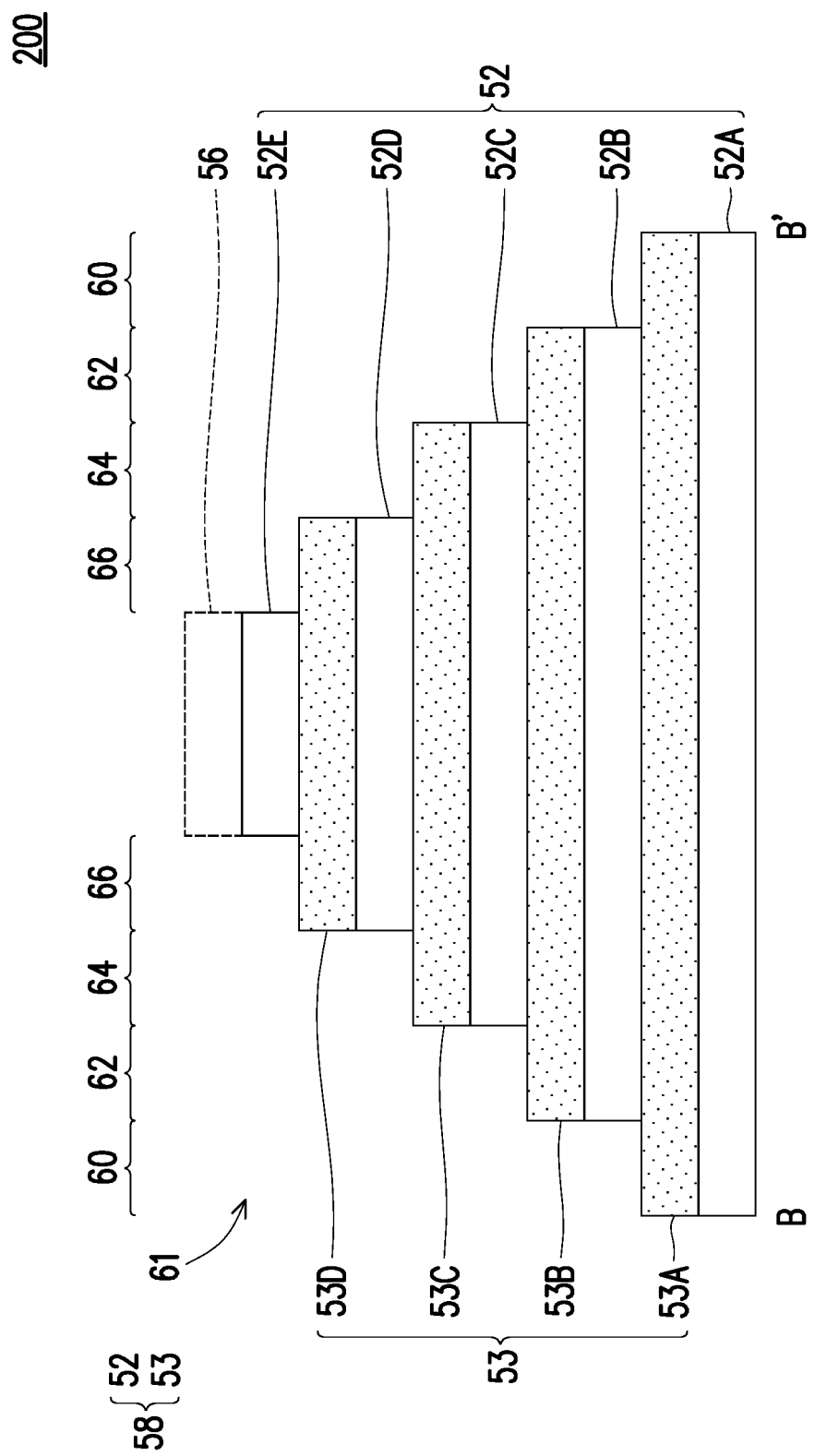

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
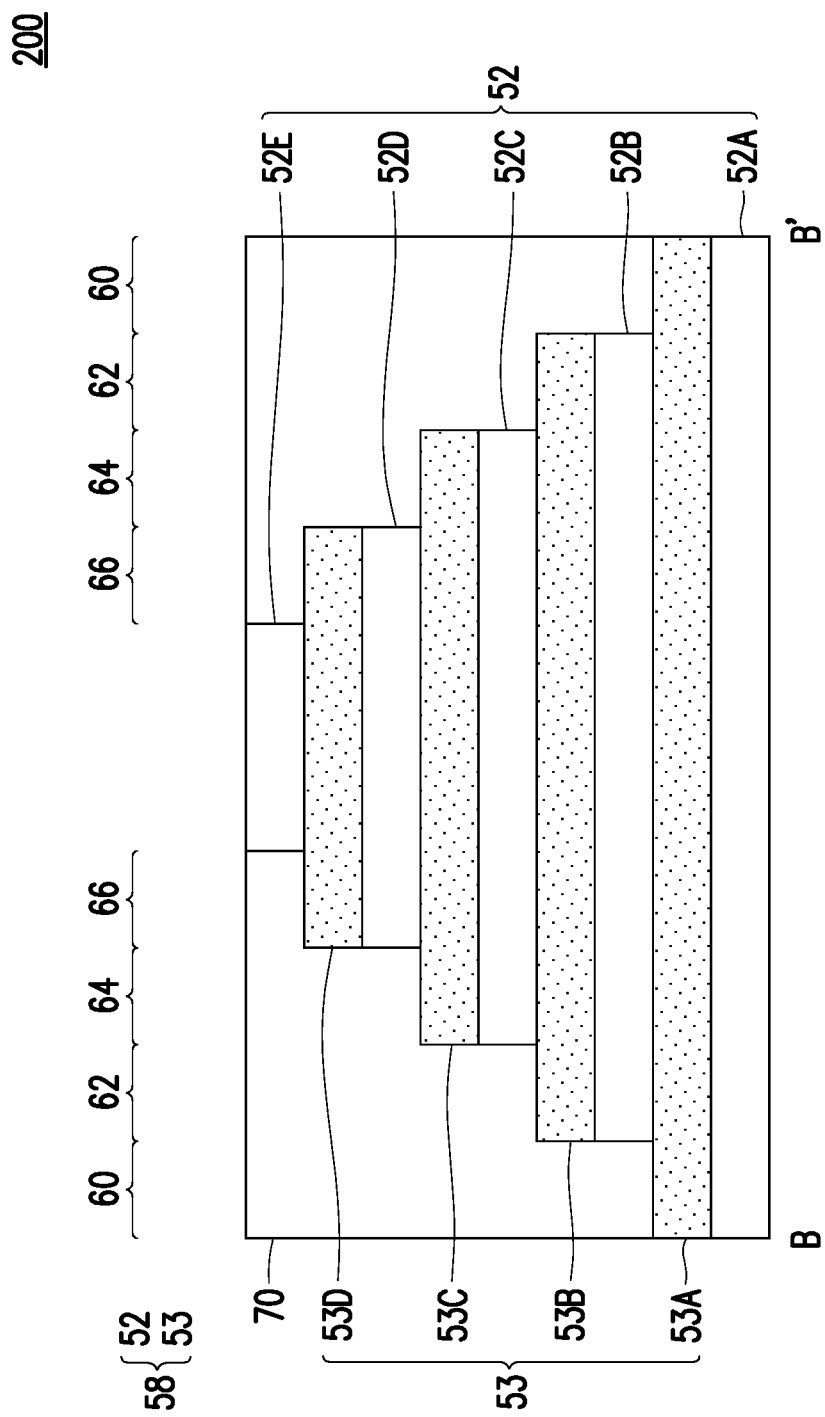

In FIG. 12, an inter-metal dielectric (IMD) 70 is formed over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 includes an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process is a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Figure 27:
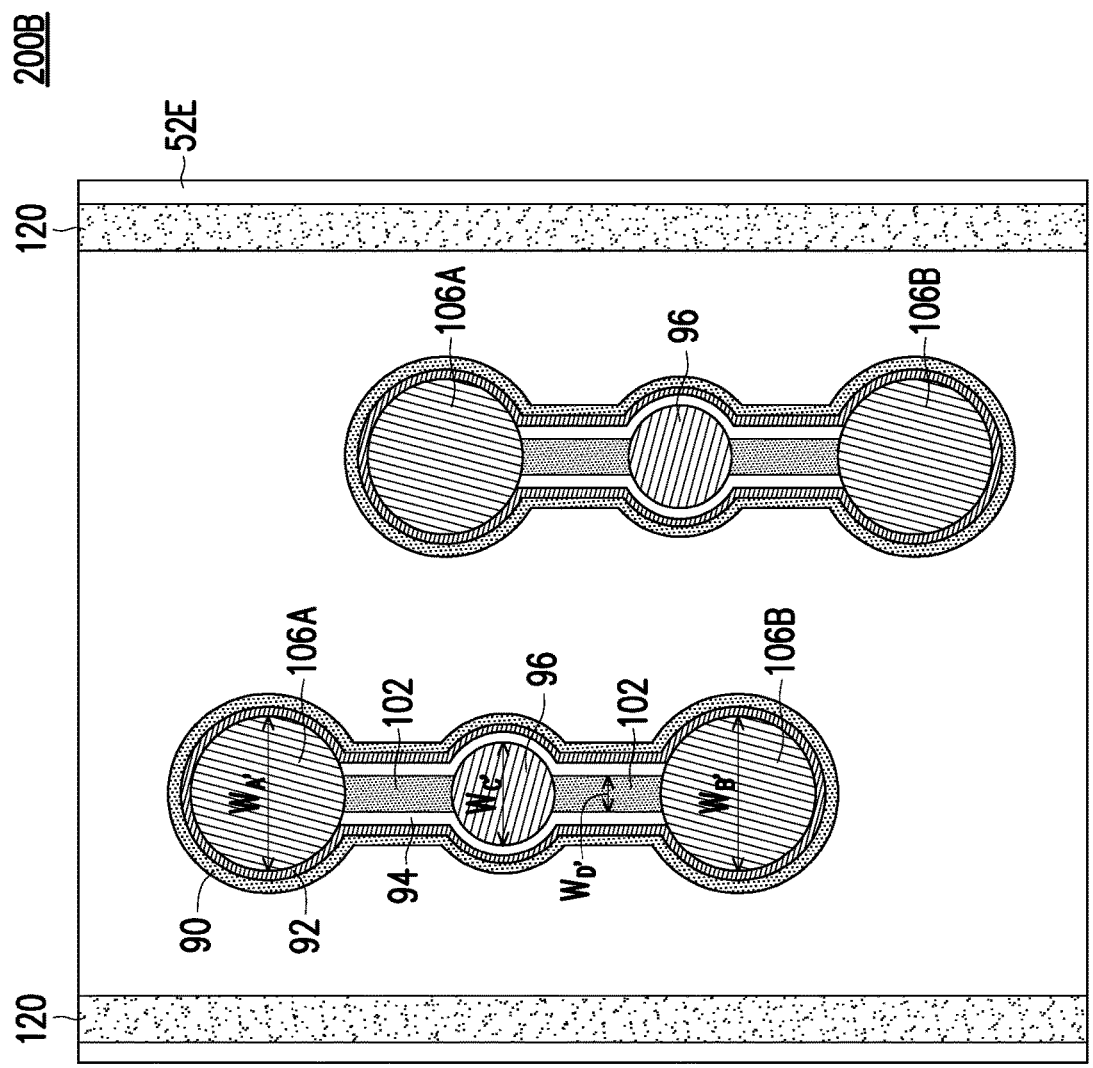
FIG. 27 illustrate a top down view of a memory device in accordance with some embodiments.

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive layers 112, which will be described in details in FIGS. 24A through 26B. Lower conductive layers 112 are longer and extend laterally past upper conductive layers 112, and a width of each of the conductive layers 112 increases in a direction towards the substrate 50 (see FIGS. 1A and 27D).

FIGS. 13A through 19C are views of intermediate stages in the manufacturing of a memory material layer, a channel layer, a gate dielectric layer, a gate electrode layer and an assist gate of the memory device 200, in accordance with some embodiments. FIGS. 13A, 14A, 15A, 16A, 17A, 18A and 19A illustrate top-down views. FIGS. 13B, 14B, 15B, 16B, 17B, 18B and 19B are illustrated along reference cross-section D-D' illustrated in FIGS. 13A, 14A, 15A, 16A, 17A, 18A and 19A (also along reference cross-section D-D' illustrated in FIG. 1A). FIGS. 13C, 14C, 15C, 16C, 16C, 17C, 18C and 19C are illustrated along reference cross-section C-C' illustrated in FIGS. 13A, 14A, 15A, 16A, 17A, 18A and 19A (also along reference cross-section C-C' illustrated in FIG. 1A).

Figure 13A:
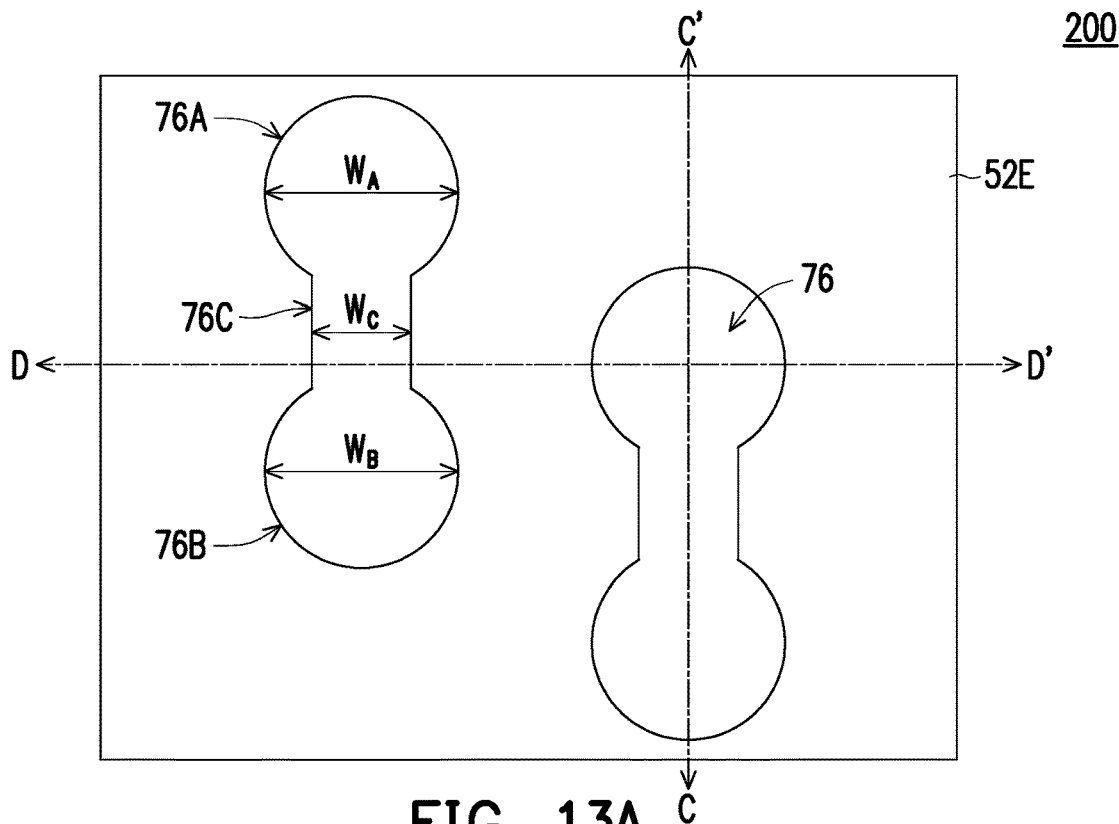
Figure 13B:
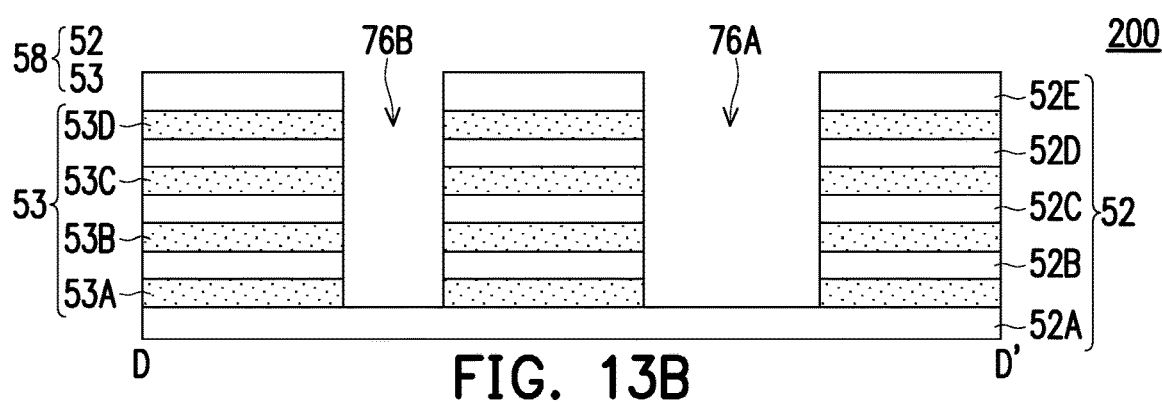
Figure 13C:
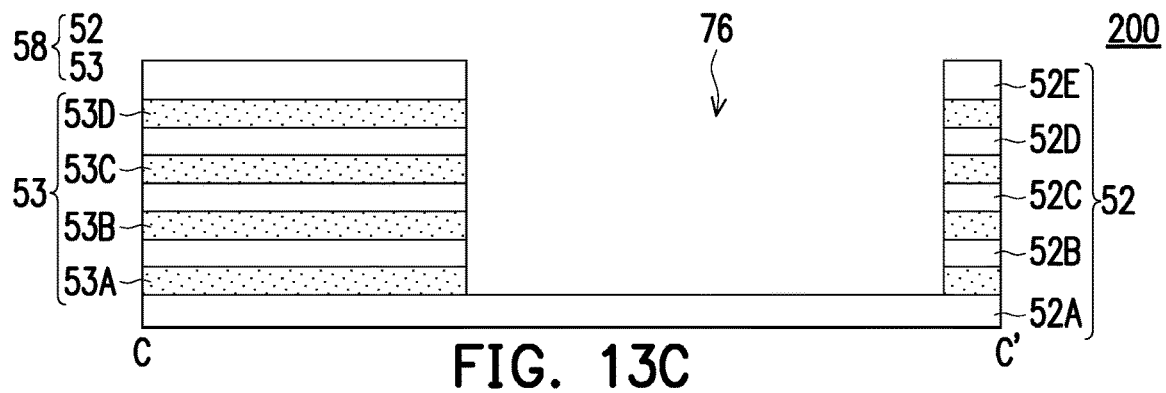

In FIGS. 13A to 13C, the multi-layer stack 58 is patterned to form trenches 76 therethrough. In some embodiments, the trenches 76 may be formed through the following method. A hard mask layer (not shown) and a photoresist layer (not shown) are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example. Thereafter, the photoresist layer is patterned to form photoresist patterns and trenches (not shown) between the photoresist patterns. The photoresist is patterned by an acceptable photolithography technique, for example. The patterns of the photoresist patterns are then transferred to the hard mask layer to form hard mask patterns by using an acceptable etching process, such as by a dry etch (e.g., RIE, NBE, the like), a wet etch, the like, or a combination thereof. The etching may be anisotropic. Thus, trenches are formed extending through the hard mask layer. Thereafter, the photoresist patterns may be optionally removed by an ashing process.

In FIGS. 13A to 13C, the patterns of the hard mask patterns are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 76 are formed extending through the multi-layer stack 58. The hard mask patterns may be then removed by an acceptable process, such as a wet etching process, a dry etching process, a planarization process, combinations thereof, or the like.

The trench 76 may include a first part 76A, a second part 76B and a third part 76C that communicate with each other. The third part 76C is located between and narrower than the first part 76A and the second part 76B. The third part 76C has a third width $W_C$ less than a first width $W_A$ of the first part 76A and less than a second width $W_B$ of the second part 76B. In some embodiments, the first width $W_A$ is substantially equal to the second width $W_B$, and greater than the third width $W_C$. For example, the first width W A and the second width $W_B$ is greater than the third width $W_c$ by at least 20 nm or more. The first part 76A and the second part 76B may be any shape such as a circular-like shape, an oval-like shape, and a polygon-like shape from a top view. The third part 76C may be any shape such as a rectangle-like shape.

Figure 14A:
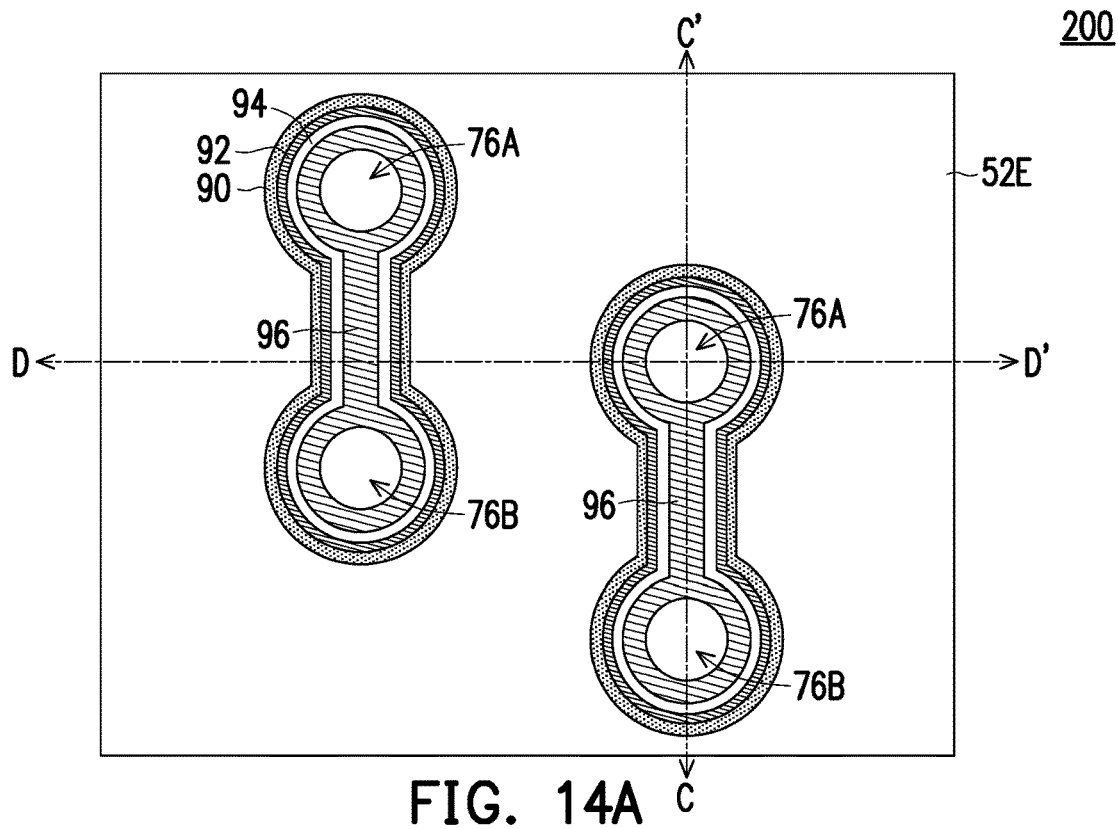
Figure 14B:
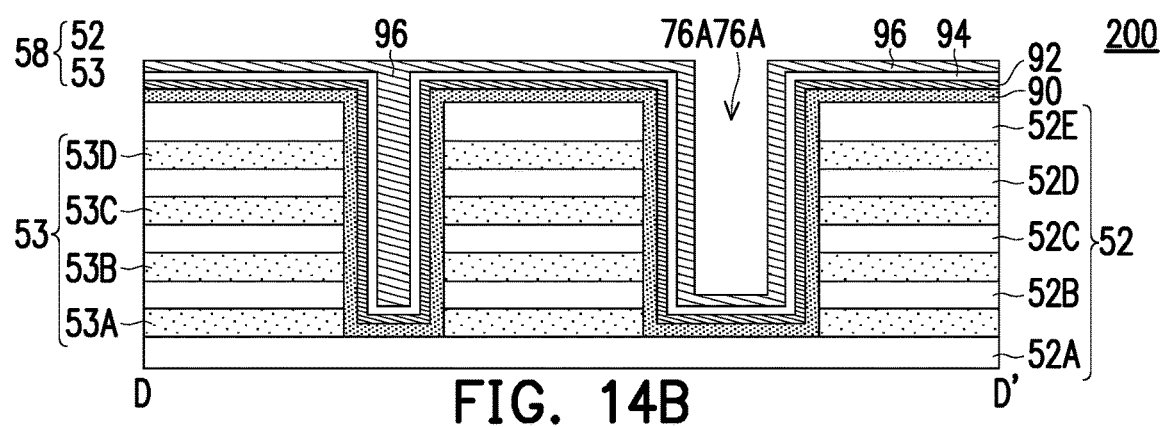
Figure 14C:
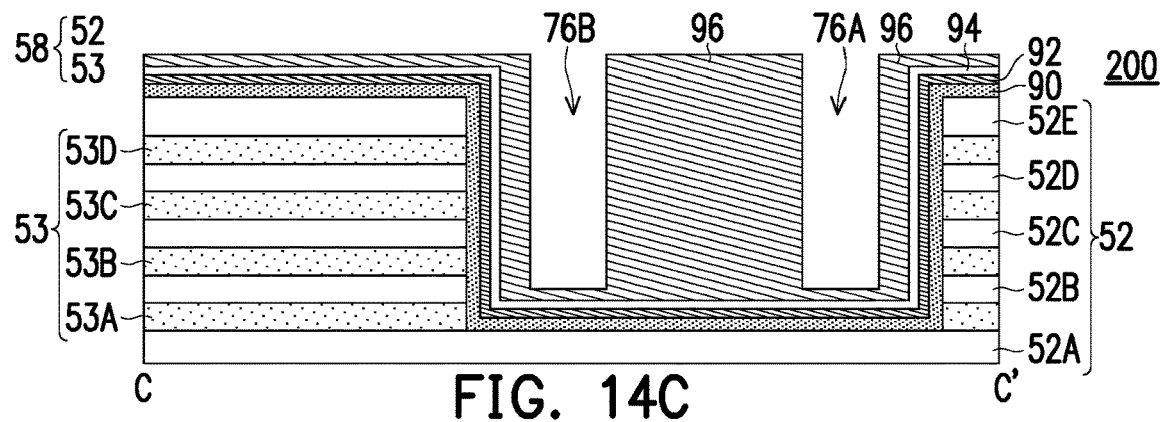

In FIGS. 14A to 14C, a memory material layer 90, a channel layer 92, a gate dielectric layer 94 and a conductive material 96 are formed in the trenches 76. The memory material layer 90 may be deposited conformally in the trenches 76 along sidewalls and bottom surfaces of the trenches 76. The memory material layer 90 may include a material that is capable of switching between two different polarization directions by applying an appropriate voltage differential across the memory material layer 90. For example, the memory material layer 90 includes a high-k dielectric material, such as a hafnium (Hf) based dielectric materials or the like. In some embodiments, the memory material layer 90 includes hafnium oxide, hafnium zirconium oxide, silicon-doped hafnium oxide, or the like.

In some embodiments, the memory material layer 90 includes lead zirconium titanate (Pb[Zr$_3$Ti]O$_3$, PZT), barium titanium oxide (BaTiO$_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium zirconium oxide (Hf$_{1-x}$Zr$_x$O, HZO), hafnium titanium oxide (Hf$_{1-x}$Ti$_x$O), hafnium tantalum oxide (Hf$_{1-x}$Ta$_x$O), aluminum scandium nitride (AlScN) or a combination thereof, or the like. In some embodiments, the memory material layer 90 include different ferroelectric materials or different types of memory materials. For example, the memory material layer 90 is replaced with a non-ferroelectric material, such as a multilayer memory structure comprising a layer of SiN$_x$ between two SiO$_x$ layers (e.g., an ONO structure). In some embodiments, the method of forming the memory material layer 90 includes performing a suitable deposition technique, such as CVD, PECVD, metal oxide chemical vapor deposition (MOCVD), ALD, RPALD, PEALD, MBD or the like.

In some embodiments, the memory material layer 90 has a thickness of about 1-50 nm, such as 5-10 nm. Other thickness ranges (e.g., more than 20 nm or 5-15 nm) may be applicable. In some embodiments, the memory material layer 90 is formed in a fully amorphous state. In alternative embodiments, the memory material layer 90 is formed in a partially crystalline state; that is, the memory material layer 90 is formed in a mixed crystalline-amorphous state and having some degree of structural order. In yet alternative embodiments, the memory material layer 90 is formed in a fully crystalline state. In some embodiments, the memory material layer 90 is a single layer. In alternative embodiments, the memory material layer 90 is a multi-layer structure.

After the memory material layer 90 is deposited, an annealing step may be performed, so as to achieve a desired crystalline lattice structure for the memory material layer 90. In some embodiments, upon the annealing process, the memory material layer 90 is transformed from an amorphous state to a partially or fully crystalline state. In alternative embodiments, upon the annealing memory material layer 90 is transformed from a partially crystalline state to a fully crystalline state.

Then, the channel layer 92 is conformally deposited in the trenches 76 over the memory material layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO, IWO), indium gallium zinc oxide (InGaZnO, IGZO), indium zinc oxide (InZnO), indium tin oxide (ITO), combinations thereof, or the like. In some embodiments, the channel layer 92 includes polycrystalline silicon (poly-Si), amorphous silicon (a-Si), or the like. The channel layer 92 may be deposited by CVD, PVD, ALD, PECVD, or the like. The channel layer 92 may extend along the sidewalls and the bottom surfaces of the trenches 76 over the memory material layer 90. After the channel layer 92 is deposited, an annealing step may be performed to activate the charge carriers of the channel layer 92.

In FIGS. 14A to 14C, the gate dielectric layer 94 is conformally deposited in the trenches 76 over the channel layer 92. The gate dielectric layer 94 includes a high-k dielectric material, such as such as AlO$_x$, HfO$_x$, ZrO$_x$, TiO$_x$, or a combination thereof, or the like. In some embodiments, the gate dielectric layer 94 include different types of gate dielectric layer. For example, the gate dielectric layer 94 is replaced with a non-ferroelectric material, such as a multilayer memory structure comprising a layer of SiN$_x$ between two SiO$_x$ layers (e.g., an ONO structure). In some embodiments, the method of forming the memory material layer 90 includes performing a suitable deposition technique, such as CVD, PECVD, metal oxide chemical vapor deposition (MOCVD), ALD, RPALD, PEALD, MBD or the like.

The conductive material 96 is deposited in the trenches 76 over the gate dielectric layer 94. The conductive material 96 includes a metal such as Ru, Cu, Al, W, Pt, Au, a combination thereof or the like, a metal compound such as TiN, or a semiconductor material such as polysilicon. In some embodiments, the method of forming the conductive material 96 includes performing a suitable deposition technique, such as CVD, PECVD, metal oxide chemical vapor deposition (MOCVD), ALD, RPALD, PEALD, MBD or the like.

The conductive material 96 is conformally deposited in the first parts 76A and the second parts 76B of the trenches 76, while the conductive material 96 fills up the third parts 76C of the trenches 76 because the third parts 76C are narrower than the first parts 76A and the second parts 76B. The conductive material 96 does not fill up the first parts 76A and the second parts 76B of the trenches 76, and gaps remain therein. A thickness of conductive material 96 is greater than half the width of a remaining space in the third part 76C, after forming the gate dielectric layer 94 so that the conductive material 96 may fill up the third parts 76C of the trenches 76.

Figure 15A:
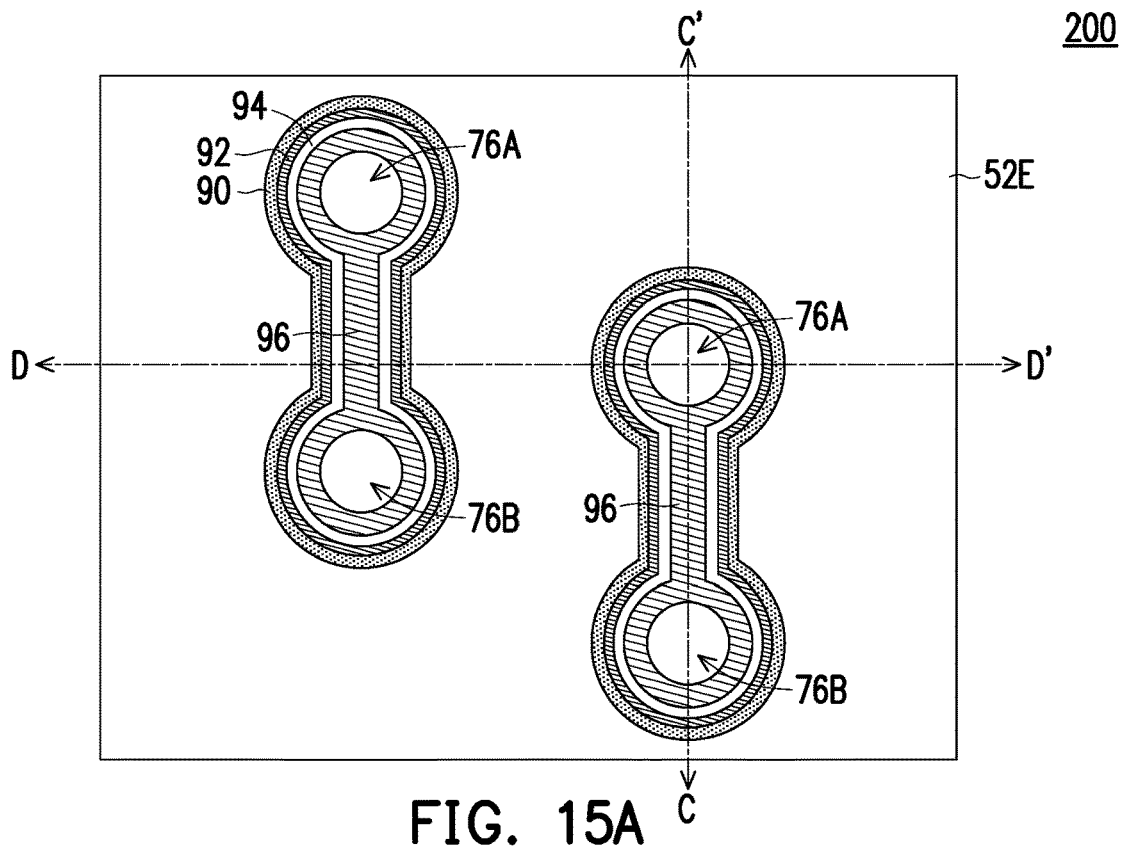
Figure 15B:
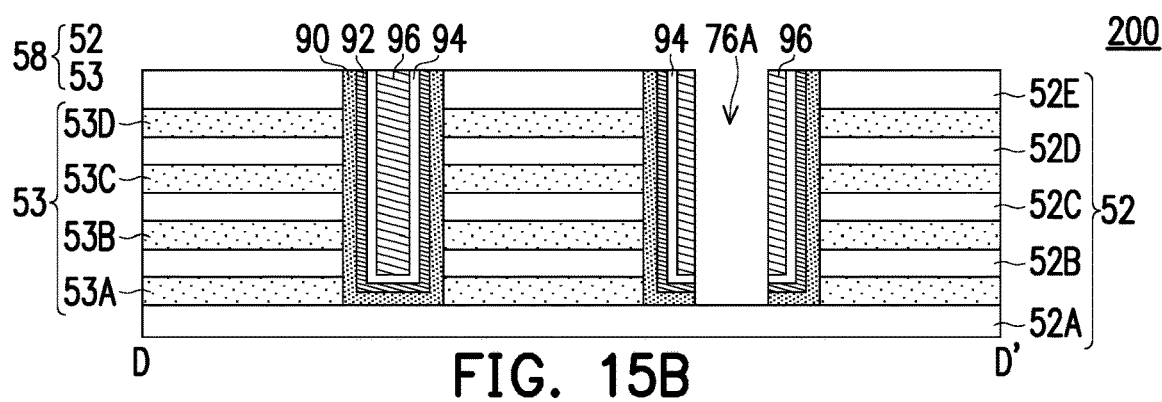
Figure 15C:
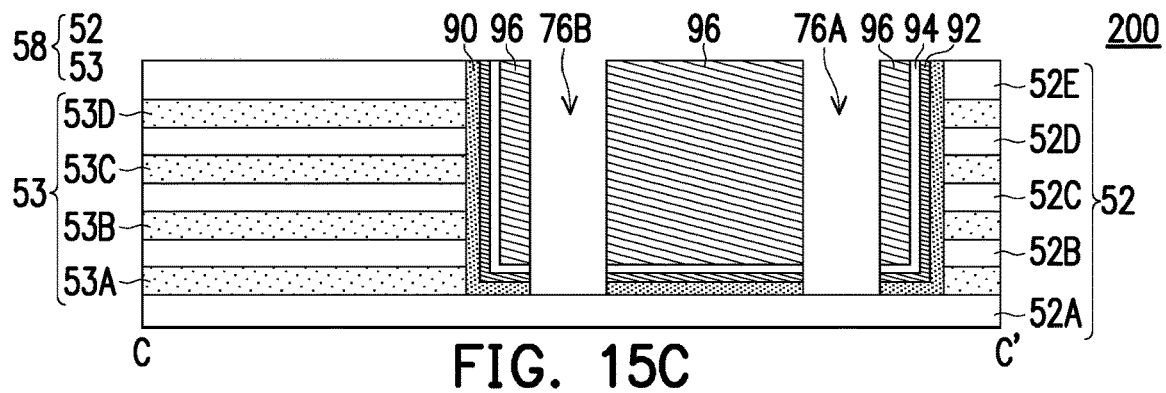

In FIGS. 15A to 15C, bottom portions of the memory material layer 90, the channel layer 92, the gate dielectric layer 94 and the conductive material 96 in the first parts 76A and the second parts 76B of the trenches 76 are removed to reveal the dielectric layer 52A. In some embodiments, most of the memory material layer 90, the channel layer 92, the gate dielectric layer 94 and the conductive material 96 remain in the third parts 76C of the trenches 76, while top portions of the memory material layer 90, the channel layer 92, the gate dielectric layer 94 and the conductive material 96 are also removed from the multi-layer stack 58. The removal process includes an etching back process, such as a dry etch (e.g., RIE, NBE, the like), a wet etch, the like, or a combination thereof. The etching may be anisotropic. For example, the removal process is a blanket etch.

In some embodiments, as shown in FIG. 15A, the memory material layer 90, the channel layer 92 and the gate dielectric layer 94 are ring-shaped. From a top view, the memory material layer 90, the channel layer 92 and the gate dielectric layer 94 may be any shape such as a peanut-like shape, an Arabic numeral eight-like shape, or a dumbbell-like shape according to the shape of the trench 76. In some embodiments, bottom inner sidewalls of the conductive material 96, the gate dielectric layer 94, the channel layer 92 and the memory material layer 90 in the first parts 76A and the second parts 76B of the trenches 76 are substantially flush with each other.

Figure 16A:
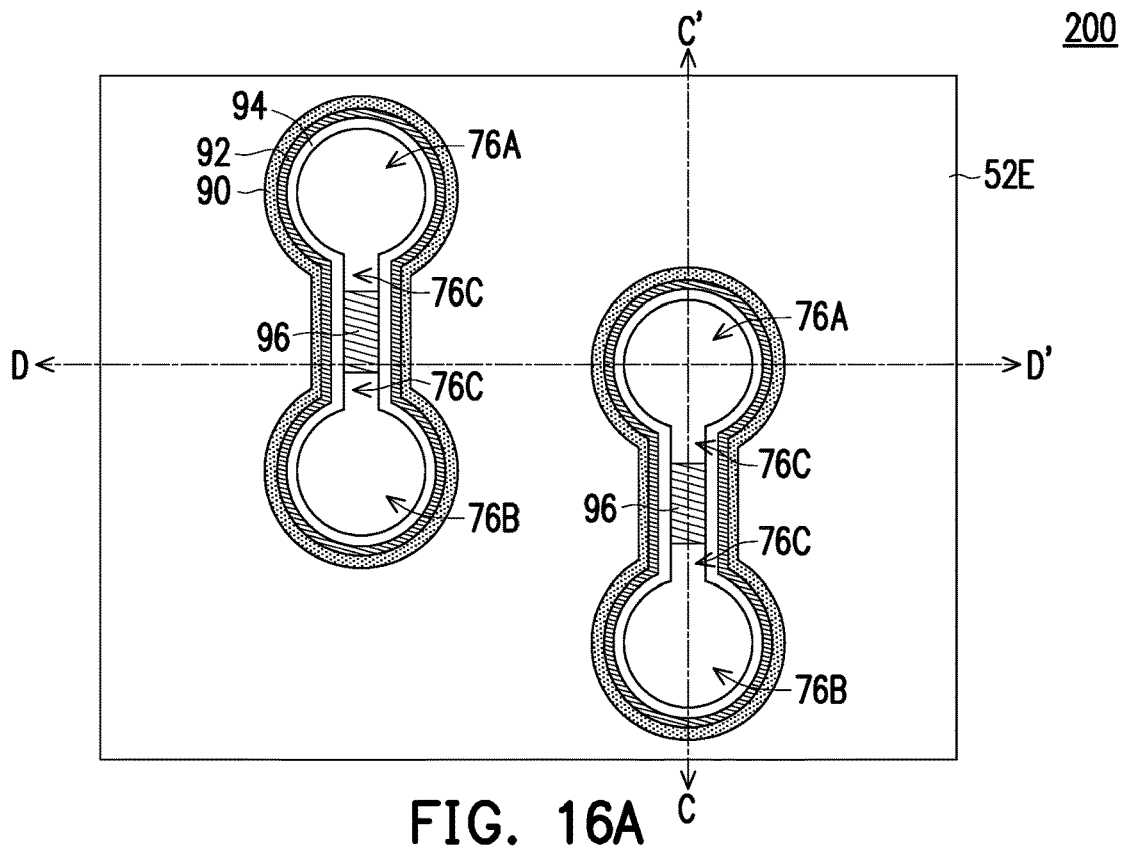
Figure 16B:
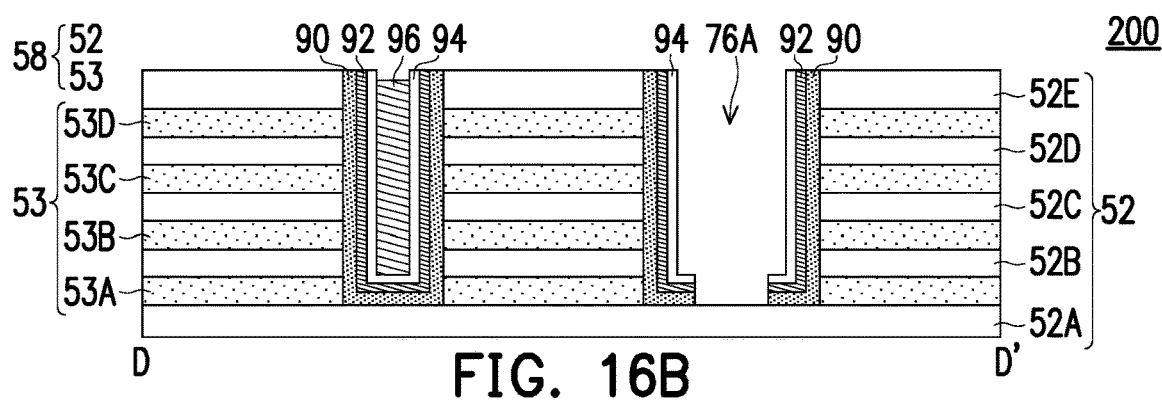
Figure 16C:
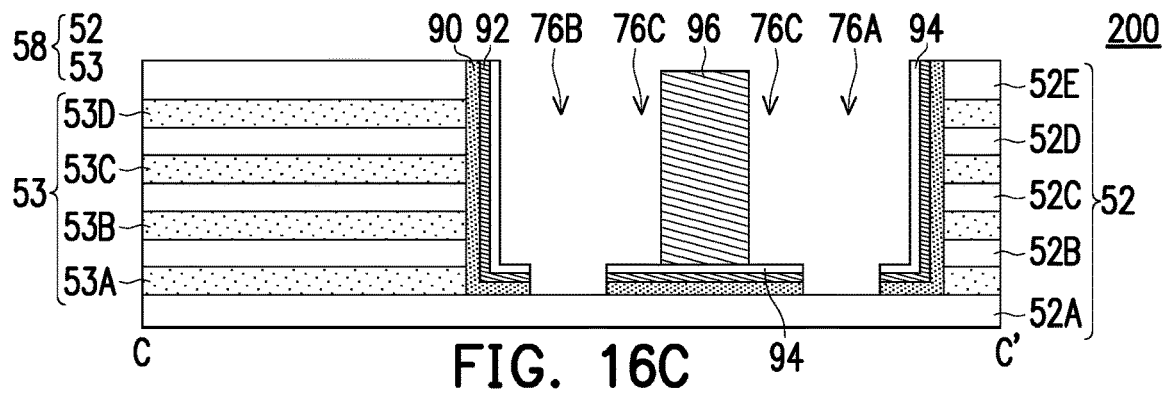

FIGS. 16A to 16C, the conductive material 96 in the first parts 76A and the second parts 76B of the trenches 76 are removed. The conductive material 96 is laterally removed and the remaining conductive material 96 is left self-aligned in the third parts 76C of the trenches 76. Top portion of the conductive material 96 is partially removed to form recesses R1 on the remaining conductive material 96. The removal process includes an etching back process, such as a dry etch (e.g., RIE, NBE, ALE, the like), a wet etch, the like, or a combination thereof. The etching may be anisotropic. For example, the removal process is a blanket etch process and/or a pull back process. The remaining conductive material 96 may extend along a direction perpendicular to the conductive layers 112. Thus, the remaining conductive material 96 may be referred to as conductive pillars 96. The conductive pillars 96 may be any shape such as such as a rectangle-like shape.

FIGS. 17A through 20C illustrate intermediate steps of manufacturing conductive pillars 106A and 106B (e.g., source/drain pillars) in the memory device 200. The conductive pillars 106A and 106B may extend along a direction perpendicular to the conductive layers 112 such that individual cells of the memory device 200 may be selected for read and write operations. FIGS. 17A, 18A, 19A, and 20A illustrate top-down views. FIGS. 17B, 18B, 19B, and 20B are illustrated along reference cross-section D-D' illustrated in FIGS. 17A, 18A, 19A, and 20A (also along reference cross-section D-D' illustrated in FIG. 1A). FIGS. 17C, 18C, 19C, and 20C are illustrated along reference cross-section C-C' illustrated in FIGS. 17A, 18A, 19A, and 20A (also along reference cross-section C-C' illustrated in FIG. 1A).

Figure 17A:
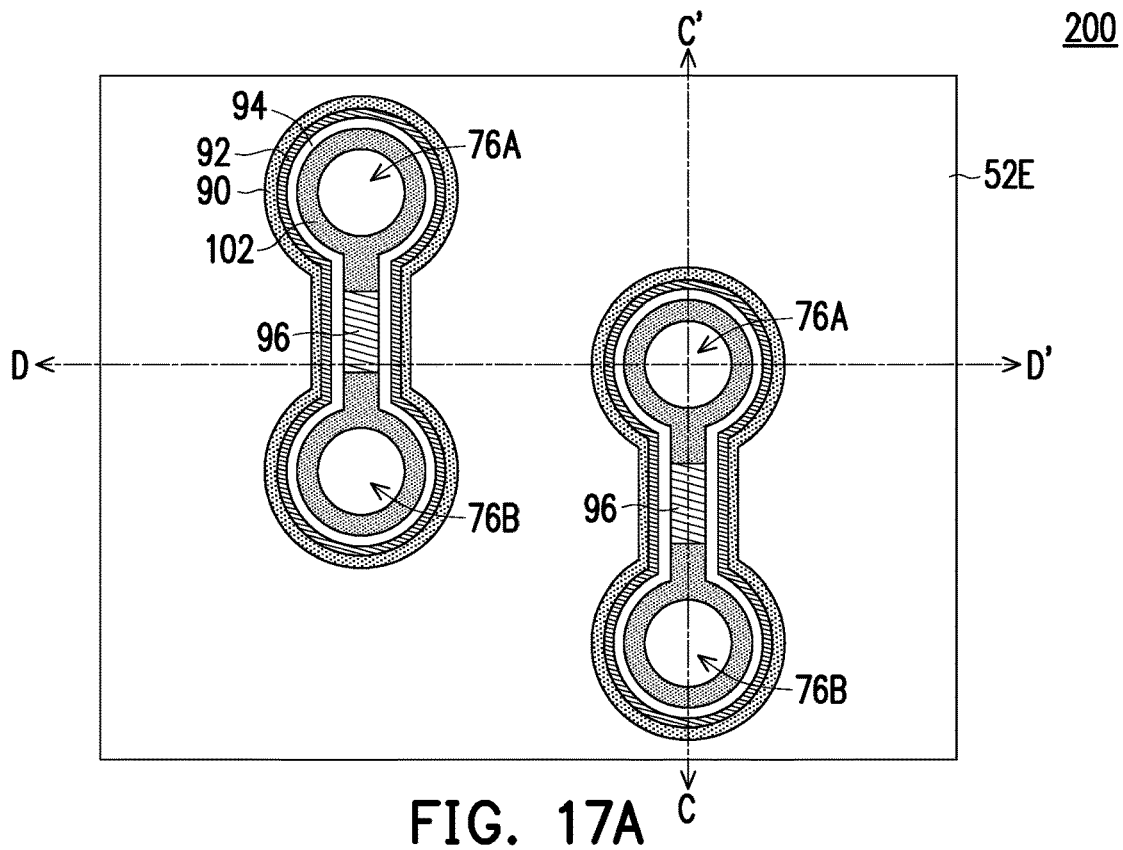
Figure 17B:
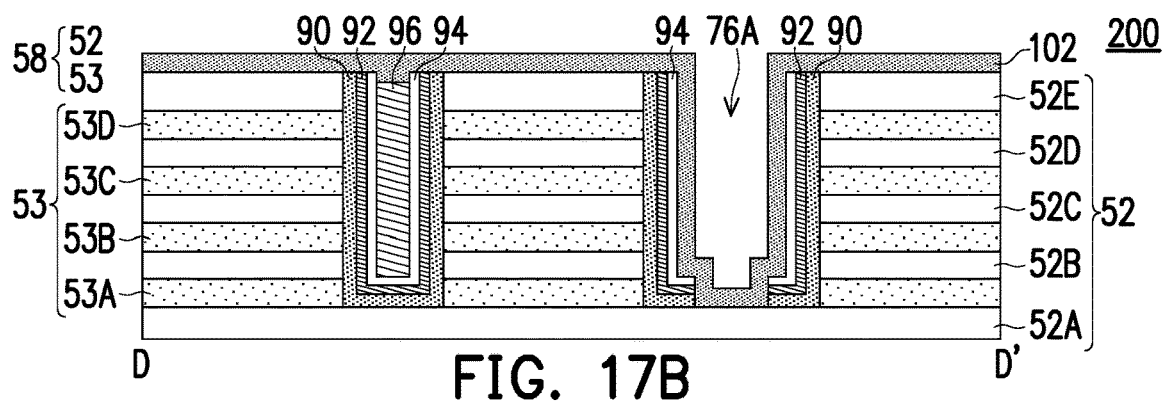
Figure 17C:
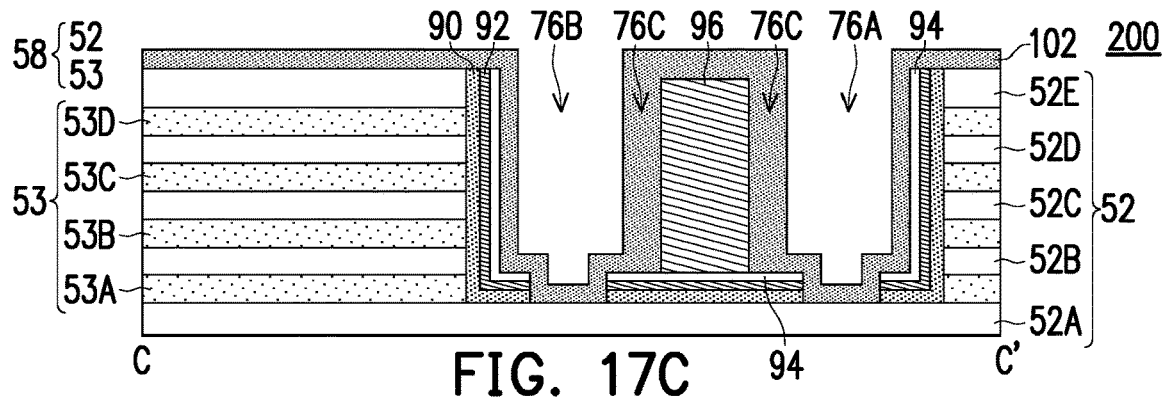

In FIGS. 17A to 17C, a dielectric material 102 is conformally deposited over the multi-layer stack 58, on the gate dielectric layer 94 in the first parts 76A and the second parts 76B of the trenches 76 and on the tops and the sidewalls of the conductive pillars 96 in the third parts 76C. The dielectric material 102 may include silicon oxide, silicon nitride, silicon oxynitride, silicon carbide, silicon oxycarbide, silicon carbonitride, aluminum oxide, or the like, which is deposited by CVD, PVD, ALD, PECVD, or the like.

Figure 18A:
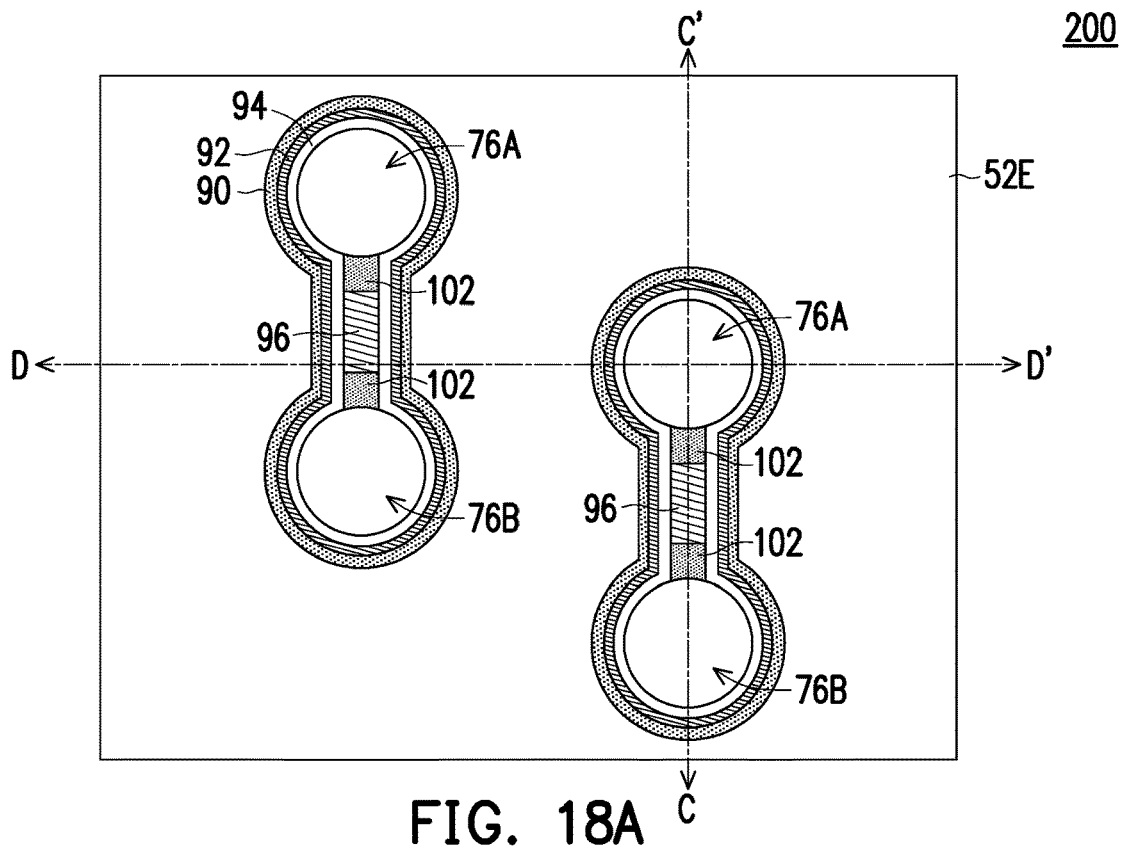
Figure 18B:
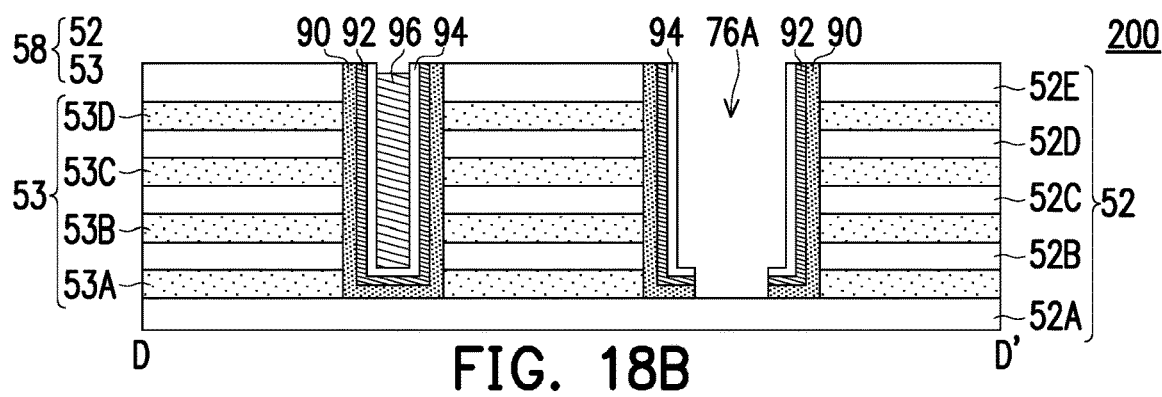
Figure 18C:
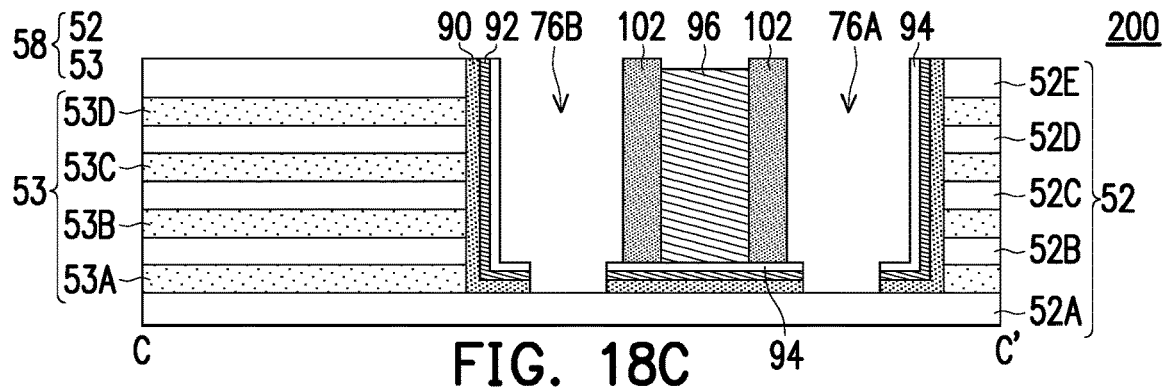

In FIG. 18A to 18C, the dielectric material 102 over the multi-layer stack 58, on the gate dielectric layer 94 in the first parts 76A and the second parts 76B of the trenches 76 and on the tops of the conductive pillars 96 in the third parts 76C are removed to leave the dielectric material 102 on the sidewalls of the conductive pillars 96 in the third parts 76C. The remaining dielectric material 102 may extend along a direction perpendicular to the conductive layers 112. The removal process includes an etching back process, such as a dry etch (e.g., RIE, NBE, the like), a wet etch, the like, or a combination thereof. The etching may be anisotropic. For example, the removal process is a blanket etch and/or a pull back. The remaining dielectric material 102 is left self-aligned in the third parts 76C of the trenches 76. The remaining dielectric material 102 may extend along a direction perpendicular to the conductive layers 112. Thus, the remaining dielectric material 102 may be referred to as dielectric pillars 102. The dielectric pillars 102 are at opposite sides of the conductive pillars 96. From a top view, the dielectric pillar 102 may be any shape such as a rectangle-like shape. The dielectric pillar 102 may be has flat sidewalls or arcuate sidewalls.

Figure 19A:
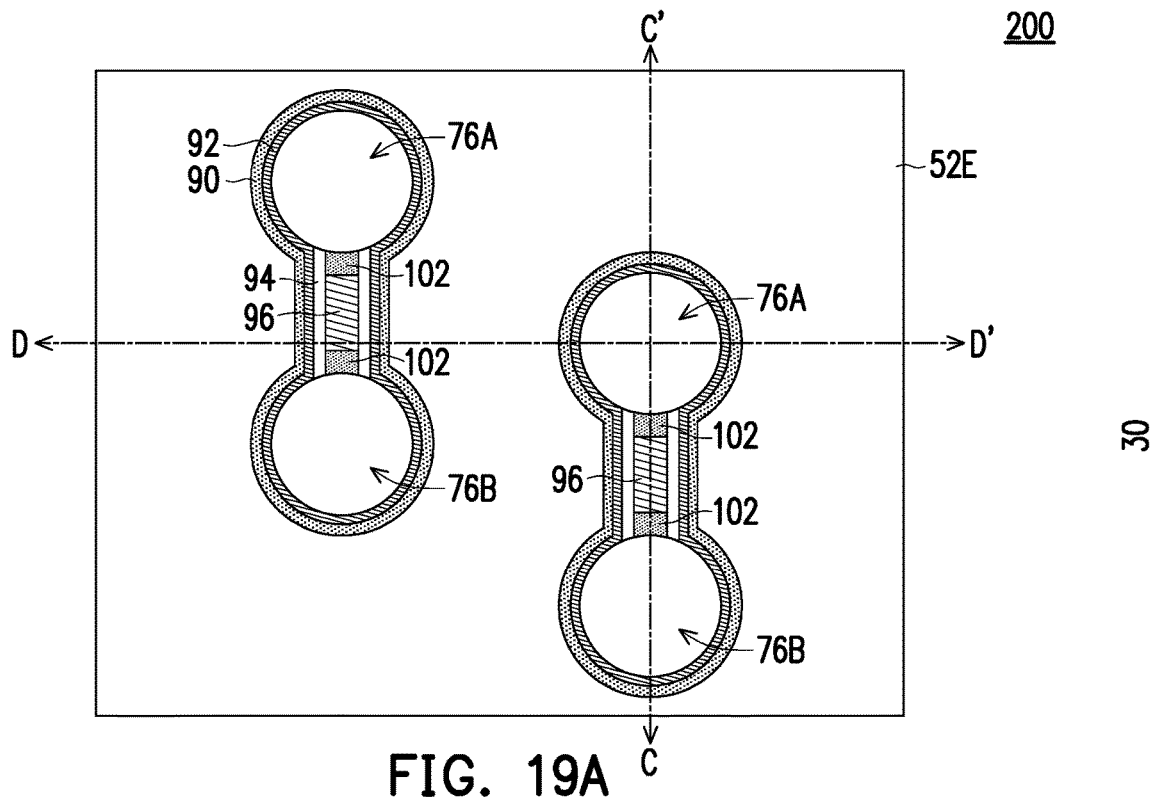
Figure 19B:
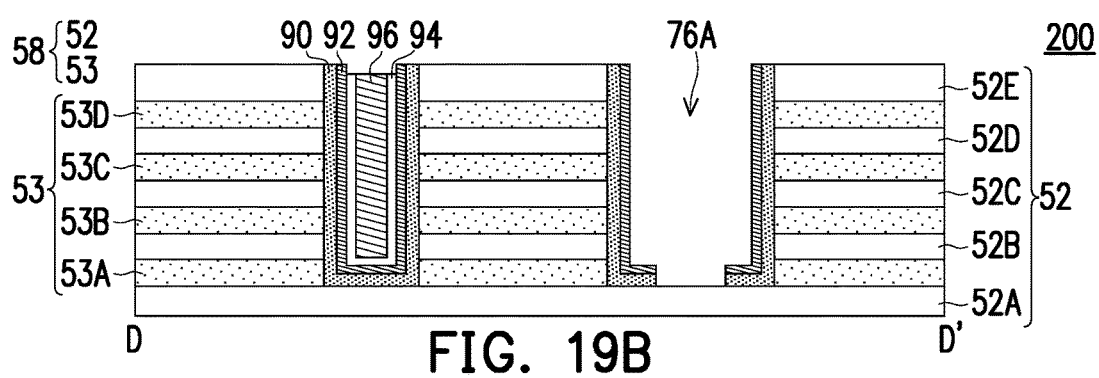
Figure 19C:
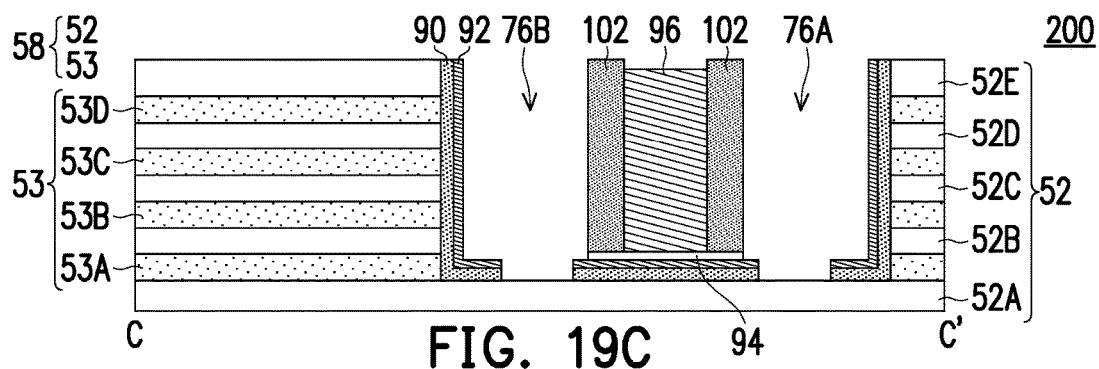

In FIGS. 19A to 19C, the gate dielectric layer 94 in the first parts 76A and the second parts 76B is removed to leave the gate dielectric layer 94 in the third parts 76C. The removal process includes an etching back process, such as a dry etch (e.g., RIE, NBE, ALE, the like), a wet etch, the like, or a combination thereof. The etching may be anisotropic. For example, the removal process is a blanket etch. The remaining gate dielectric layer 94 may extend along a direction perpendicular to the conductive layers 112 and extend along a direction parallel to the conductive layers 112. The remaining gate dielectric layer 94 is left self-aligned in the third parts 76C of the trenches 76. The remaining gate dielectric layer 94 is located between the channel layer 92 and the conductive pillar 96, and between the channel layer 92 and the dielectric pillar 102. The remaining gate dielectric layer 94 surrounds two sidewalls and the bottom of the conductive pillar 96, and surrounds two sidewalls and the bottom of each dielectric pillar 102.

Figure 20A:
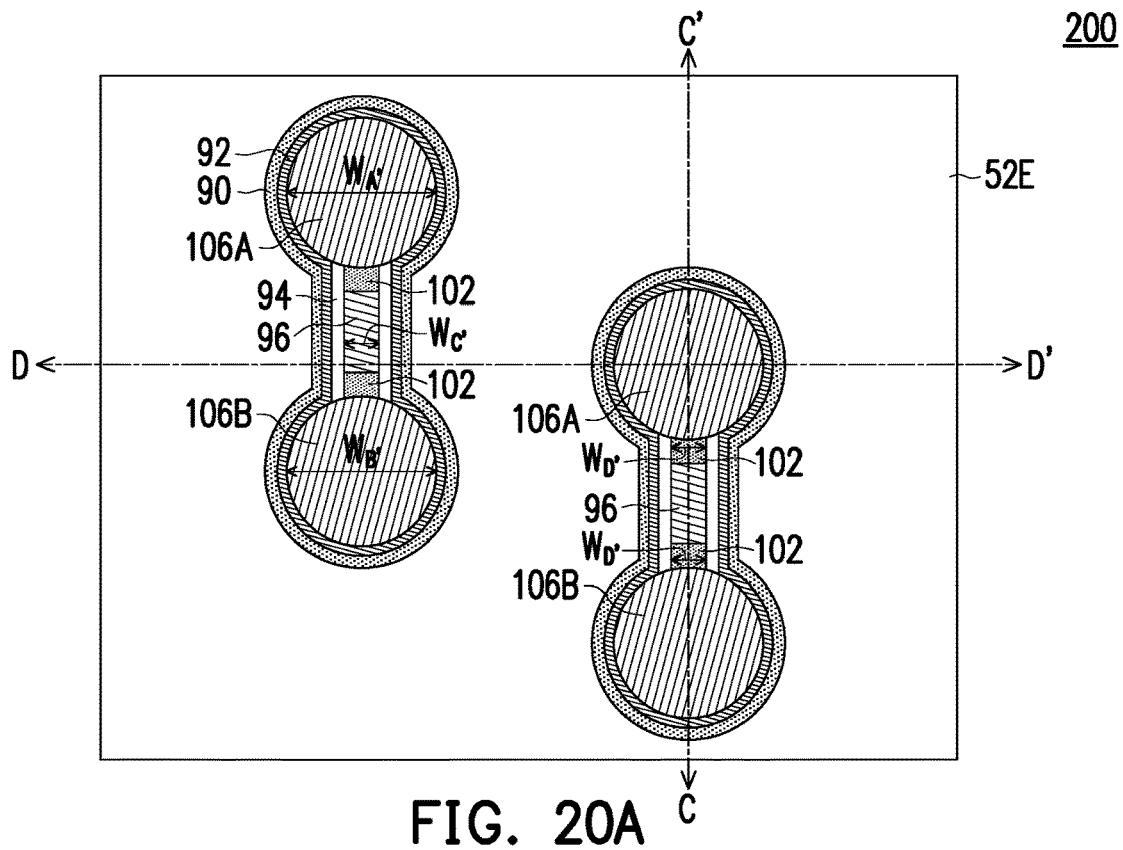
Figure 20B:
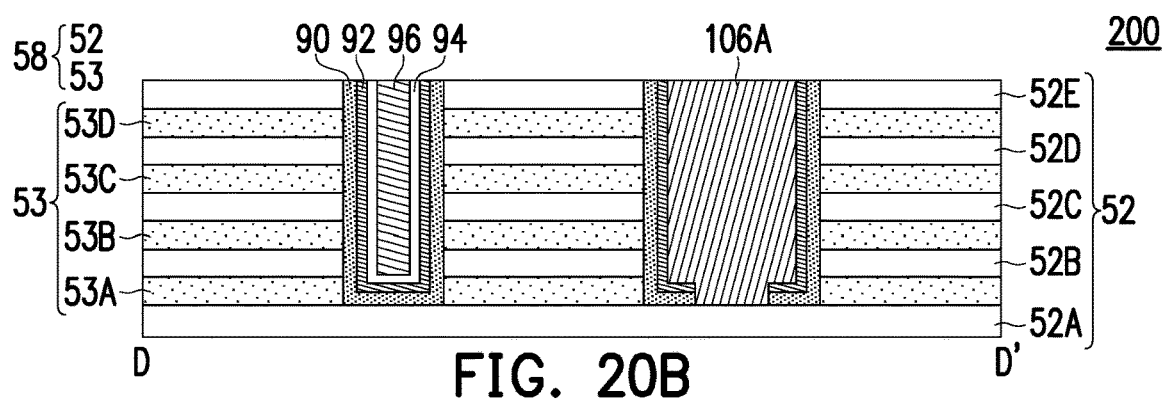
Figure 20C:
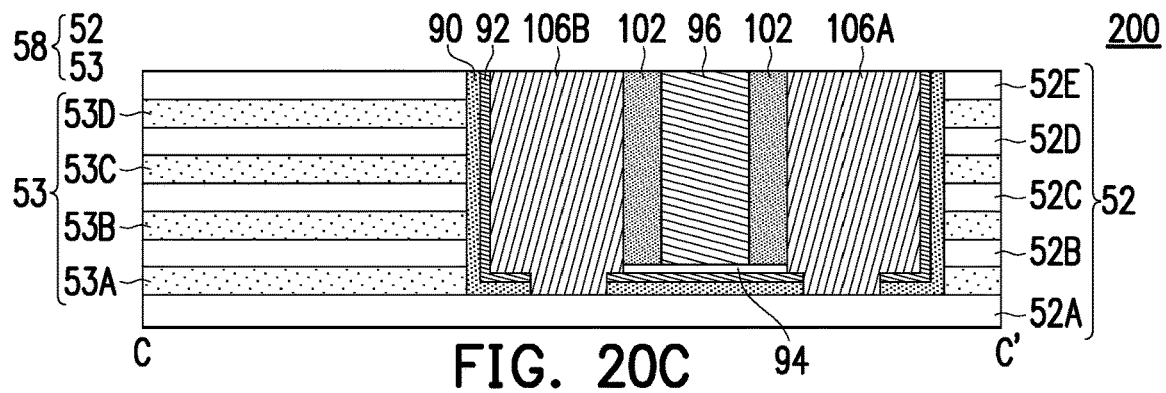

In FIGS. 20A to 20C, the first parts 76A and the second parts 76B of the trenches 76 are filled with a conductive material to form the conductive pillars 106A and 106B. The conductive material may include copper, titanium, titanium nitride, tantalum, tantalum nitride, tungsten, ruthenium, aluminum, gold, polysilicon, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106A and 106B in the first parts 76A and the second parts 76B of the trenches 76. In the resulting structure, top surfaces of the multi-layer stack 58 (e.g., the dielectric layer 52E), the memory material layer 90, the channel layer 92, the gate dielectric layer 94, the conductive pillars 96, the dielectric pillars 102, the conductive pillars 106A, and the conductive pillars 106B may be substantially level (e.g., within process variations). In some embodiments, the conductive pillars 106A correspond to and are electrically connected to the source lines in the memory device 200, the conductive pillars 106B correspond to and are electrically connected to the bit lines in the memory device 200, and the conductive pillars 96 are served as assist gates in the memory device 200. In alternative embodiments, the conductive pillars 106A correspond to and are electrically connected to the bit lines in the memory device 200, the conductive pillars 106B correspond to correspond to and are electrically connected to the source lines in the memory device 200, and the conductive pillars 96 are served as assist gates 96 in the memory device 200.

The assist gate 96 can help control the surface potential of the channel layer 92 (particularly the portions of the channel layer 92 distal the conductive layer 112) during write operations. For example, the work function of the material (e.g., tungsten) of the assist gate 96 can help reduce the surface potential of the channel layer 92. The window for write operations may thus be widened. Further, during a write operation, a biasing voltage can be applied to an assist gate 96, thereby increasing the write voltage applied across a corresponding memory material layer 90 during the write operation. The performance of the memory array may thus be improved.

The conductive pillars 106A and 106B are disposed at different sides of the conductive pillar 96. For example, the conductive pillars 106A and 106B are disposed at opposite sides of the conductive pillar 96. The conductive pillar 96 is narrower than conductive pillar 106A and conductive pillar 106B. The conductive pillar 96 has a third width $W_C'$ less than a first width $W_A'$ of conductive pillar 106A and less than a second width $W_B'$ of conductive pillar 106B. In some embodiments, the first width $W_A'$ is substantially equal to the second width $W_B'$, and greater than the third width $W_C'$. The fourth width $W_D'$ is closer to the third width $W_C'$ than the first width $W_A'$ and the second width $W_B'$. In some embodiments, the fourth width $W_D'$ is substantially equal to the third width $W_C'$, and the first width $W_A'$ and the second width $W_B'$ are greater than the third width $W_C'$ and the fourth width $W_D'$ by at least 20 nm or more. In some embodiments, the conductive pillars 106A and 106B have shapes different from the conductive pillar 96. The conductive pillars 106A and 106B may be any shape such as a circular-like shape, an oval-like shape, and a polygon-like shape from a top view. The conductive pillar 96 may be any shape such as a rectangle-like shape.

In some embodiments, the conductive pillars 106A and 106B are isolated from the conductive pillar 96 by the dielectric pillars 102. The gate dielectric layers 94 are disposed over outer sidewall surfaces of the conductive pillar 96 and the dielectric pillar 102 disposed at opposite sides of the conductive pillar 96. The conductive pillars 106A, 106B and 96, the dielectric pillars 102 and the gate dielectric layer 94 are surrounded by the channel layer 92 and the memory material layer 90. For example, the channel layer 92 and the memory material layer 90 are continuously disposed over outer sidewall surfaces of the conductive pillar 106A, the gate dielectric layer 94 and the conductive pillar 106B. The channel layer 92 may be in direct contact with the conductive pillars 106A, 106B and the gate dielectric layer 94. The memory material layer 90 may be continuously disposed on outer sidewall surfaces of the channel layer 92. In some embodiments, the memory material layer 90 is in direct contact with the outer sidewall surfaces and the bottom surface of the channel layer 92.

FIGS. 21A through 24C are views of intermediate stages in the manufacturing of conductive layers 112 of the memory device 200, in accordance with some embodiments. In FIGS. 22A through 24C, dielectric layer 108 is formed over the multi-layer stack 58 and the IMD 70, and the multi-layer stack 58 is patterned to form trenches 110 therethrough, and sacrificial layers 53 are replaced with conductive materials to define the conductive layers 112. The conductive layers 112 may correspond to word lines in the memory device 200, and the conductive layers 112 may further provide gate electrodes for the resulting memory cells of the memory device 200. FIGS. 21A, 22A, 23A, and 24A illustrate top-down views. FIGS. 21B, 22B, 23B, and 24B are illustrated along reference cross-section D-D' illustrated in FIGS. 21A, 22A, 23A, and 24A (also along reference cross-section D-D' illustrated in FIG. 1A). FIGS. 21C, 22C, 23C, and 24C are illustrated along reference cross-section C-C' illustrated in FIGS. 21A, 22A, 23A, and 24A (also along reference cross-section C-C' illustrated in FIG. 1A).

Figure 21A:
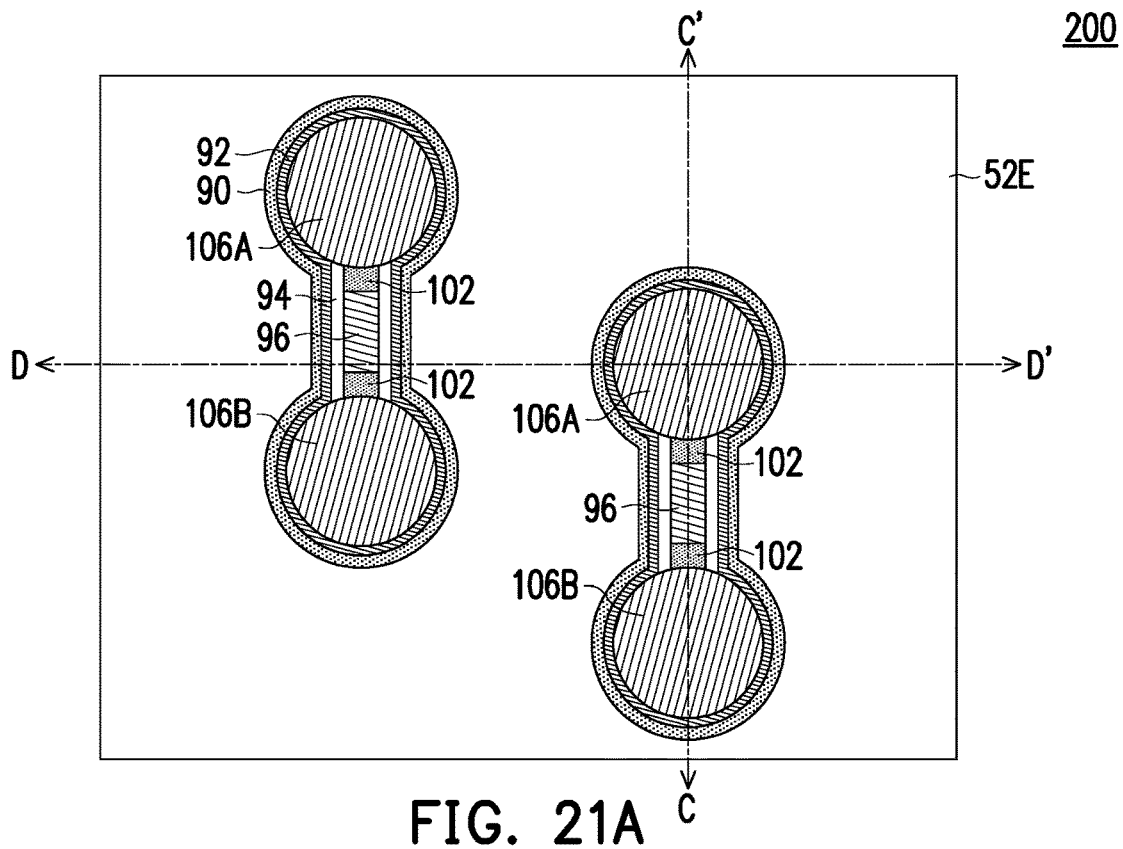
Figure 21B:
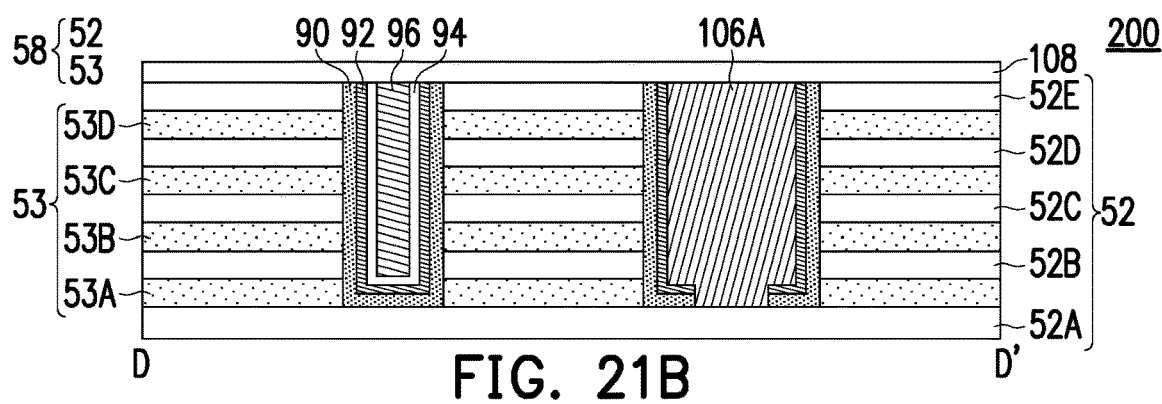
Figure 21C:
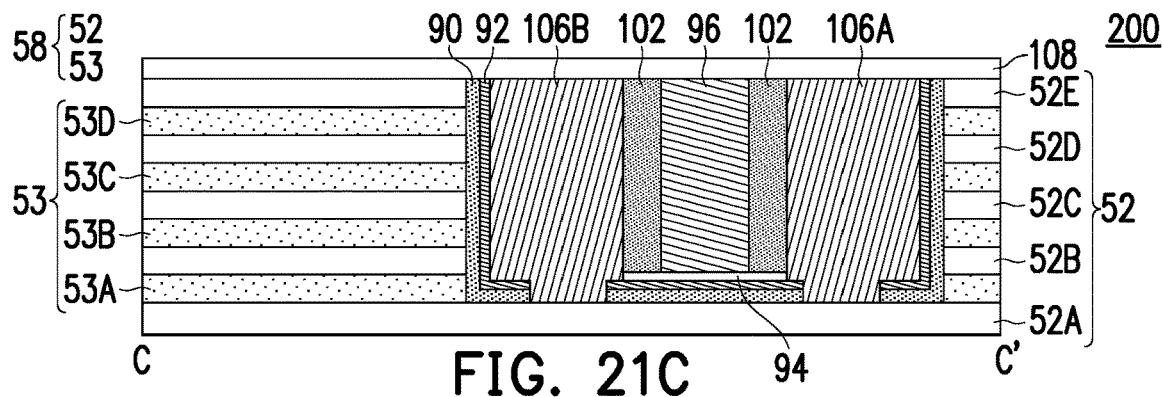

In FIGS. 21A to 21C, the dielectric layer 108 is formed over the multi-layer stack 58 and the IMD 70 (shown in FIG. 12). The dielectric layer 108 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the dielectric layer 108 includes an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process is a planarization process, such as a chemical mechanical polish (CMP), an etch-back process, combinations thereof, or the like. The planarization process exposes the multi-layer stack 58 such that top surface of the dielectric layer 108 is level after the planarization process is completed.

Figure 22A:
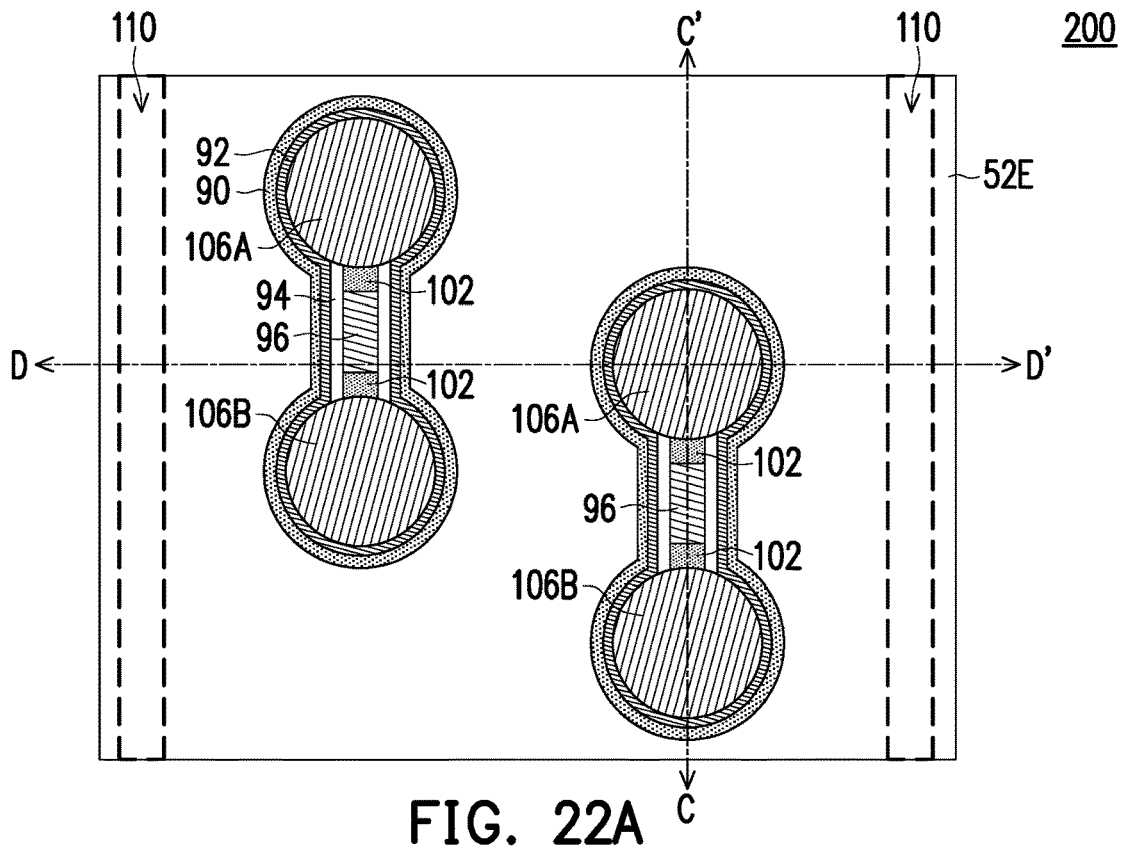
Figure 22B:
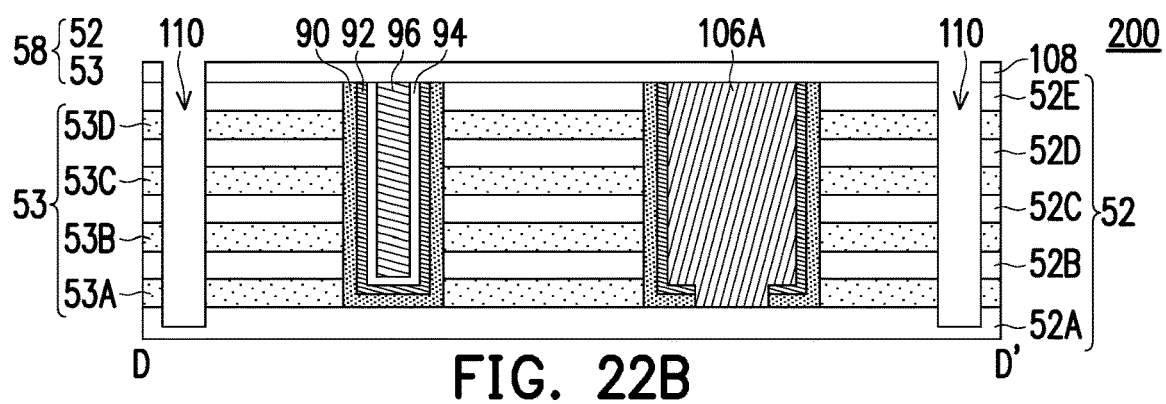
Figure 22C:
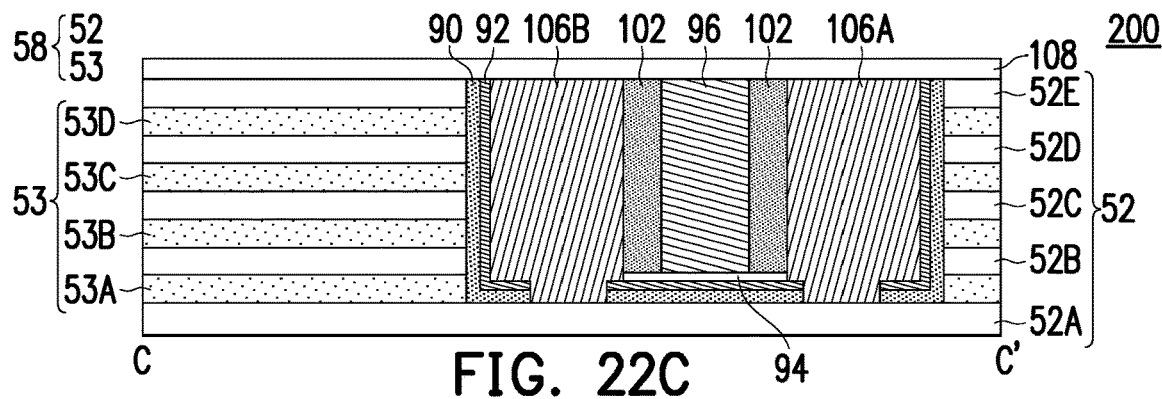

In FIGS. 22A to 22C, the multi-layer stack 58 is patterned to form trenches 110 therethrough, the trenches 110 extend through the multi-layer stack 58. The trenches 110 are formed by using a combination of photolithography and etching, for example. The etching process may be a wet etching process, a dry etching process or both.

Figure 23A:
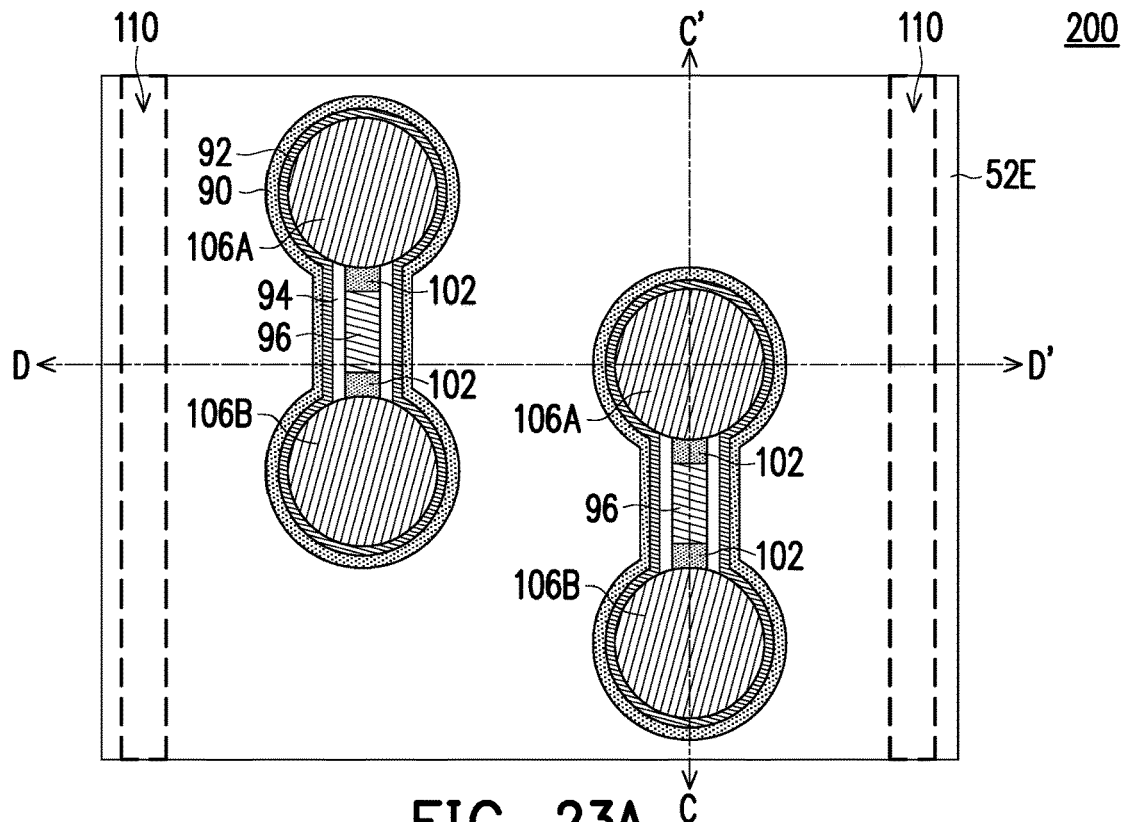
Figure 23B:
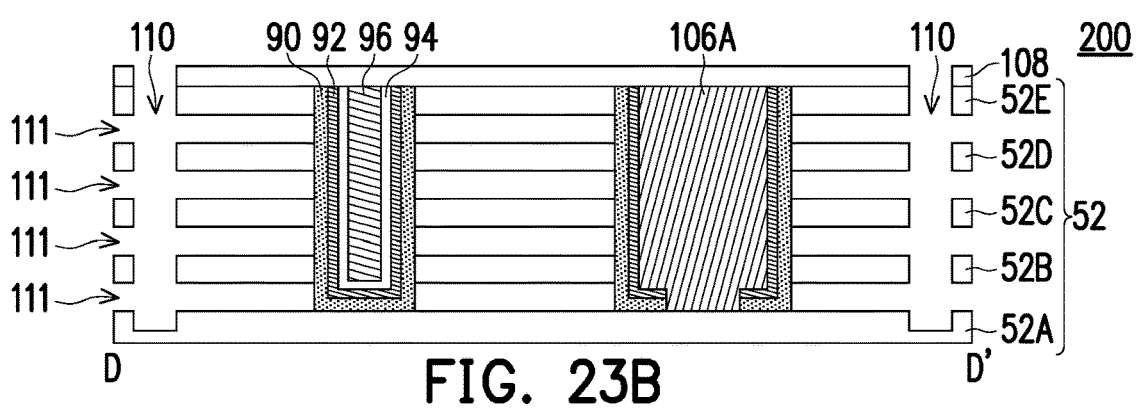
Figure 23C:
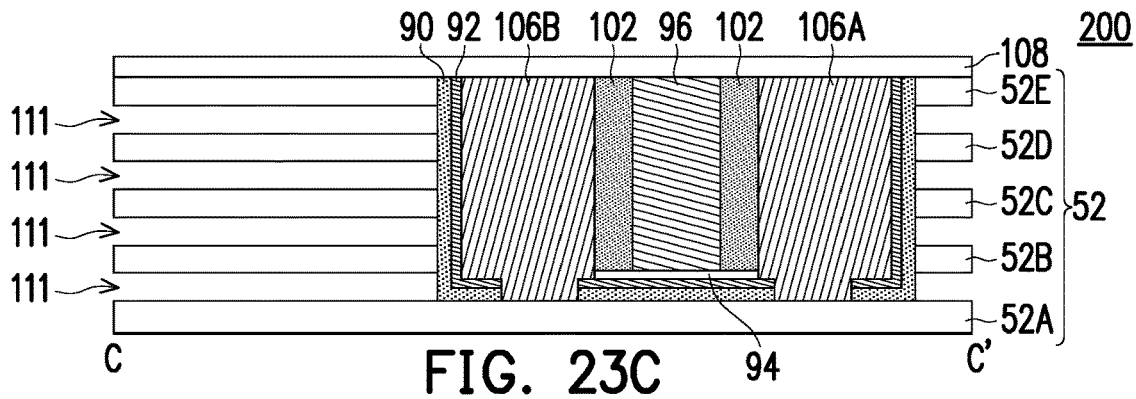

In FIG. 23A through 24C, the sacrificial layers 53A-53D (collectively referred to as sacrificial layers 53) are replaced with conductive layers (or referred to as conductive lines) 112A-112D (collectively referred to as conductive layers 112). The conductive layers 112 may be referred to as conductive lines. In FIGS. 23A through 23C, in some embodiments, the sacrificial layers 53 are removed by an etching process to form horizontal openings 111 between the dielectric layer 52A-52E (collectively referred to as dielectric layers 52). The etching process may be a wet etching process, a dry etching process or both. For example, hot phosphoric acid is used to remove the sacrificial layers 53.

Figure 24A:
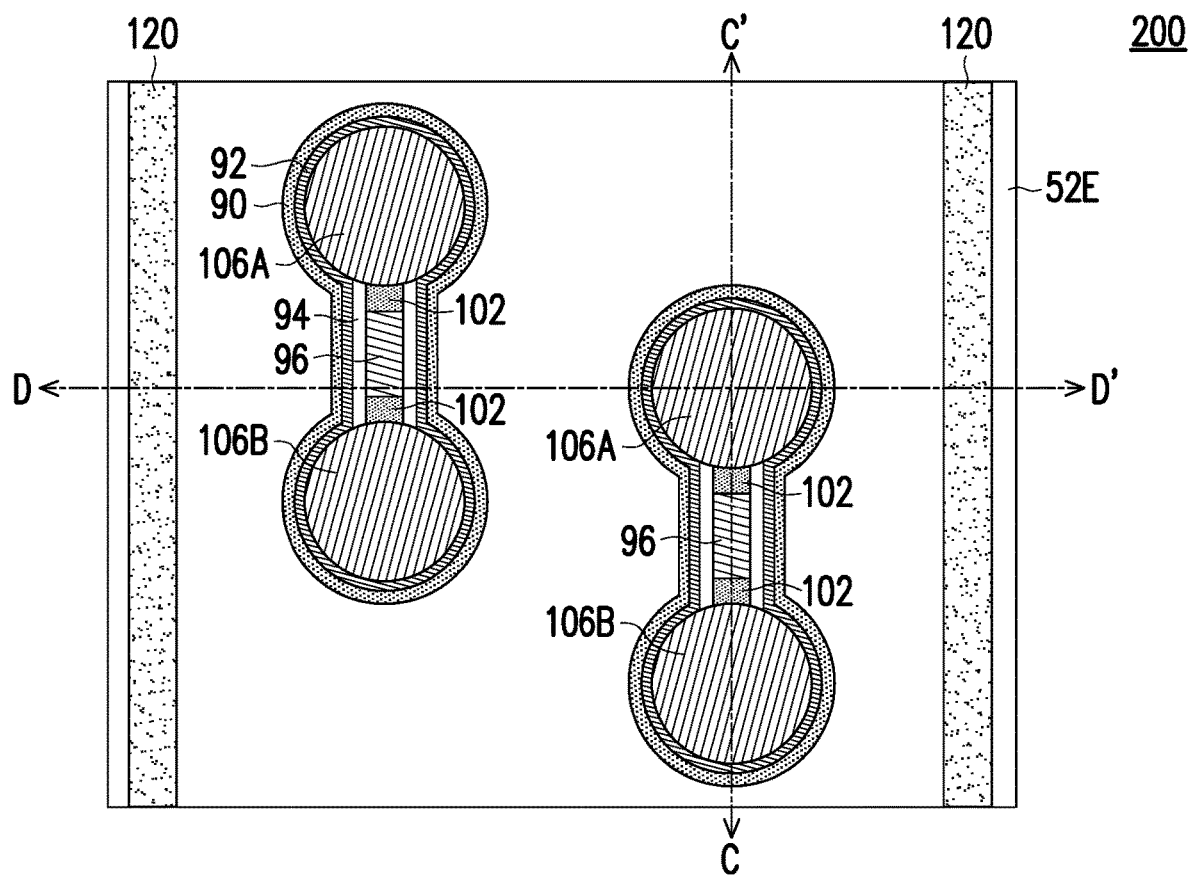
Figure 24B:
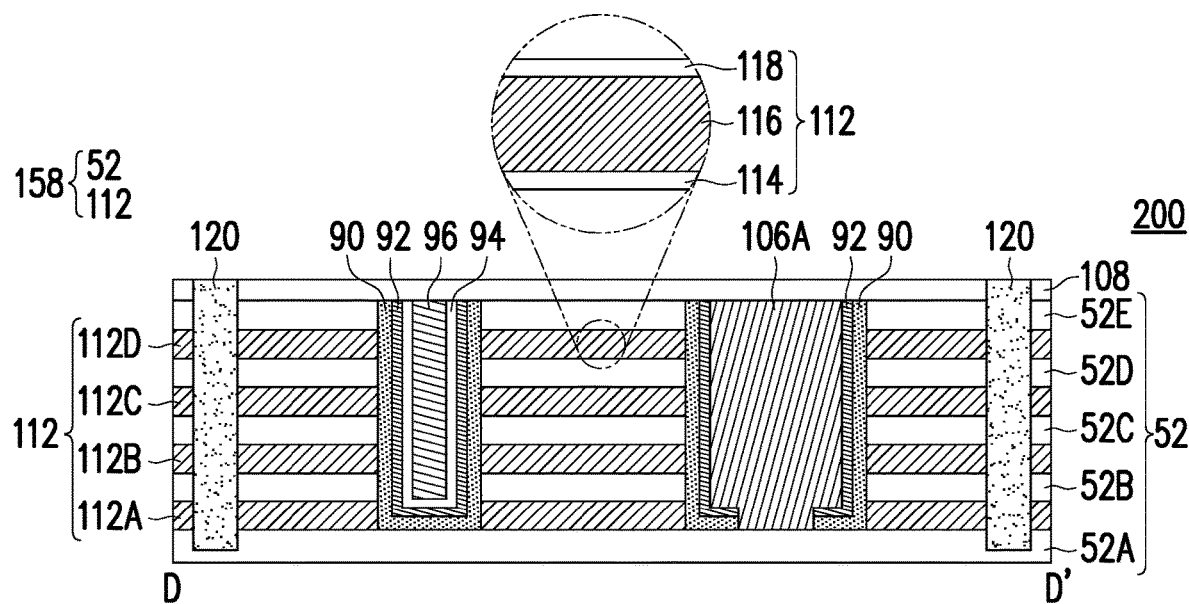
Figure 24C:
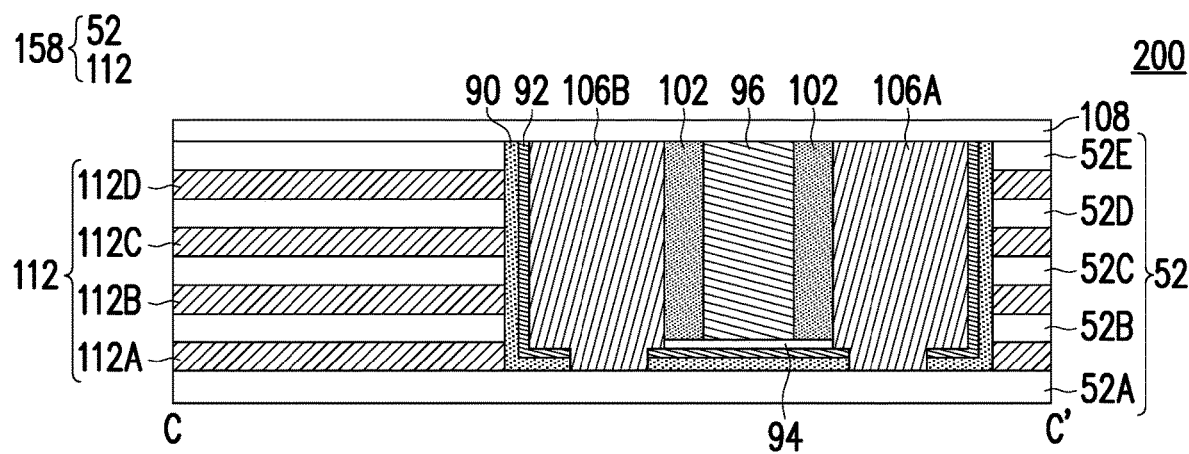

In FIGS. 24A through 24C, thereafter, conductive layers 112 are filled into the horizontal openings 111 between two adjacent dielectric layers 52 to form a multi-layer stack 158. As shown in the local enlarged view, each conductive layer 112 includes two barrier layers 114 and 118 and a metal layer 116 between the barrier layers 114 and 118. Specifically, the barrier layer 114 or 118 is disposed between the metal layer 116 and the adjacent dielectric layer 52. The barrier layers 114 and 118 may prevent the metal layer from diffusion to the adjacent dielectric layers 52. The barrier layers 114 and 118 may also provide the function of increasing the adhesion between the metal layer 116 and the adjacent dielectric layers 52, and may be referred to as glue layers in some examples. In some embodiments, both barrier layers and glue layers with different materials are provided as needed. The barrier layers 114 and 118 are formed of a first conductive material, such as a metal nitride, such as titanium nitride, tantalum nitride, molybdenum nitride, zirconium nitride, hafnium nitride, or the like. The metal layer 116 may are formed of a second conductive material, such as a metal, such as tungsten, ruthenium, molybdenum, cobalt, aluminum, nickel, copper, silver, gold, alloys thereof, or the like. The barrier layers 114, 118, and metal layer 116 may each be formed by an acceptable deposition process such as CVD, PVD, ALD, PECVD, or the like. The first conductive material of the barrier layers 114, and 118, and the second conductive material of the metal layer 116 are further deposited on the sidewalls of the dielectric layers 52 and fill in the trenches 110. Thereafter, the first conductive material of the barrier layers 114, and 118, and the second conductive material of the metal layer 116 in the trenches 110 are removed by an etching back process and/or a pull back process to avoid the short between the conductive layers 112. An acceptable etch back process and/or a pull back process may be performed to remove excess materials from the sidewalls of the dielectric layers 52 and bottom surfaces of the trenches 110. The acceptable etch back process and/or a pull back process may include a dry etch (e.g., RIE, NBE, the like), a wet etch, the like, or a combination thereof. The acceptable etch back process and/or a pull back process may be anisotropic. In some embodiments, upon the replacement process, the sacrificial layers 53 of the strip-shaped staircase structures are subsequently replaced with conductive layers 112 (see FIGS. 1A and 25D).

In FIGS. 24A and 24B, dielectric layers 120 are formed in the trenches 110 to isolate the adjacent common conductive layers 112. In some embodiments, a dielectric layer 120 is deposited over the dielectric layer 108 and filling in the trenches 110. The dielectric layer may include, for example, silicon oxide, silicon nitride, silicon oxynitride, or the like, which may be deposited by CVD, PVD, ALD, PECVD, or the like. The dielectric layer may extend along sidewalls and bottom surfaces of the trenches 110. After deposition, a planarization process (e.g., a CMP, etch back, or the like) may be performed to remove excess portions of the dielectric layer. In the resulting structure, top surfaces of the dielectric layers 120 and the dielectric layer 108 may be substantially level (e.g., within process variations).

Thus, stacked memory cells 202 may be formed in the memory device 200, as shown in FIG. 1A. Each memory cell 202 includes a gate electrode (e.g., a portion of a corresponding conductive layer 112), a first gate dielectric layer (e.g., a portion of a corresponding memory material layer 90), a channel region (e.g., a portion of a corresponding channel layer 92), and source/drain pillars (e.g., portions of corresponding conductive pillars 106A, and 106B). Each memory cell 202 further includes an assist gate (e.g., a portion of a corresponding conductive pillar 96) and a gate dielectric layer 94. The memory cells 202 may be disposed in an array of vertically stacked rows and columns. In some embodiments, adjacent rows of the memory cells 202 share a common conductive layer 112 (e.g., word line) therebetween, and the common conductive layers 112 are isolated by the dielectric layers 120 therebetween. However, the disclosure is not limited thereto.

Figure 25A:
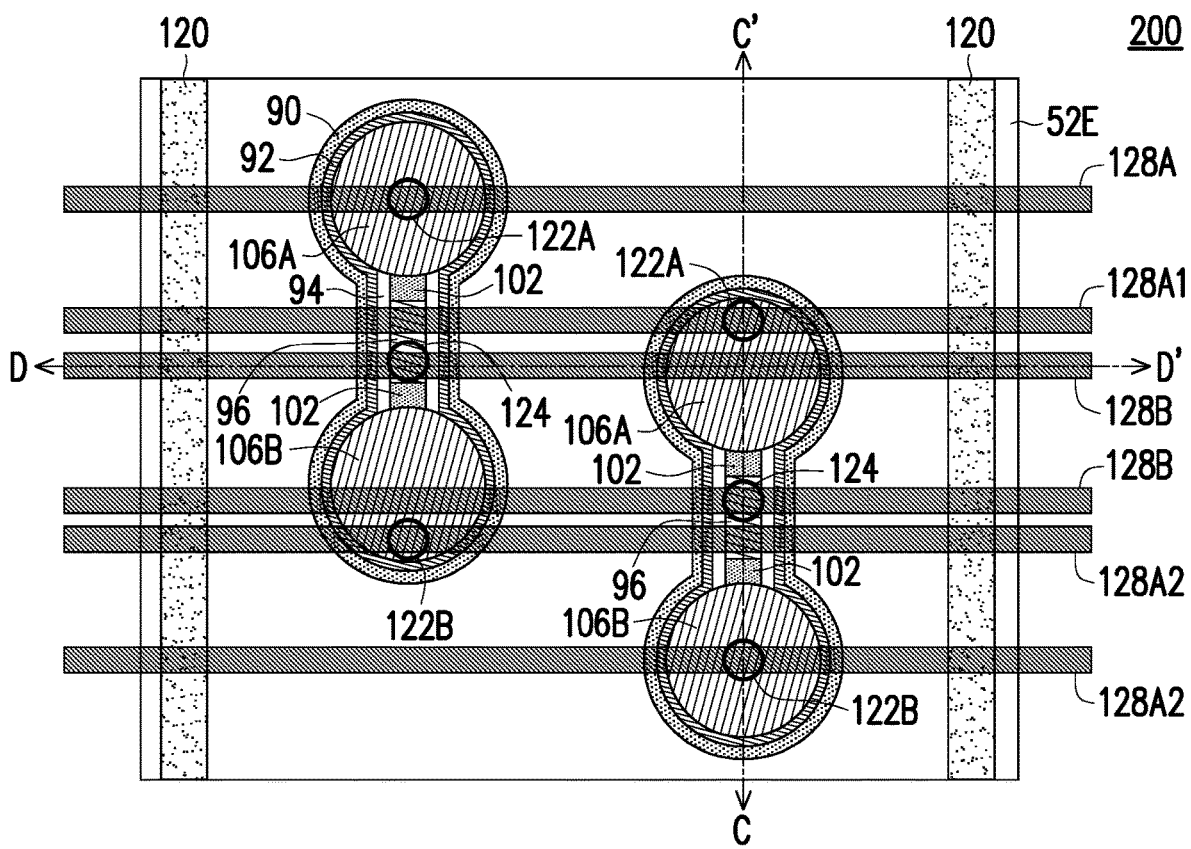
Figure 25B:
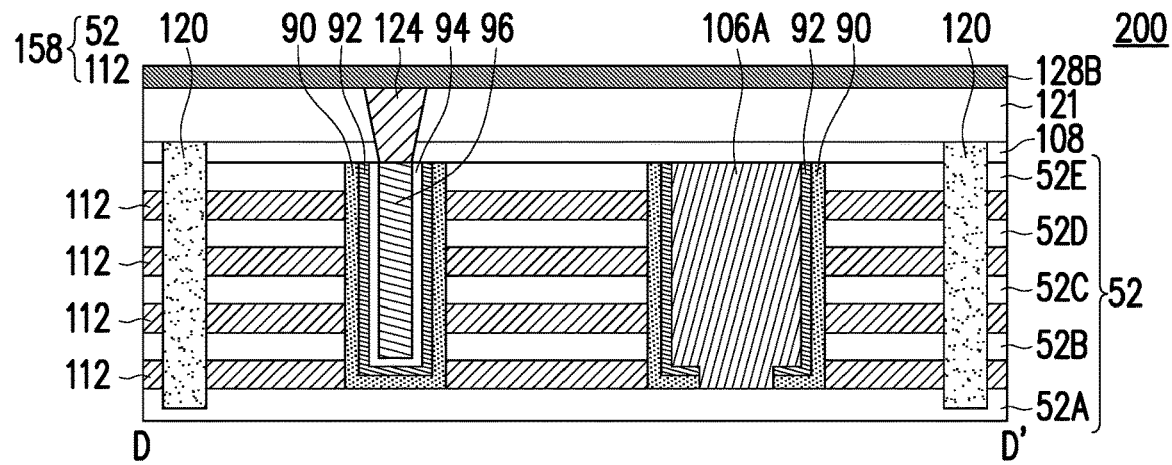
Figure 25C:
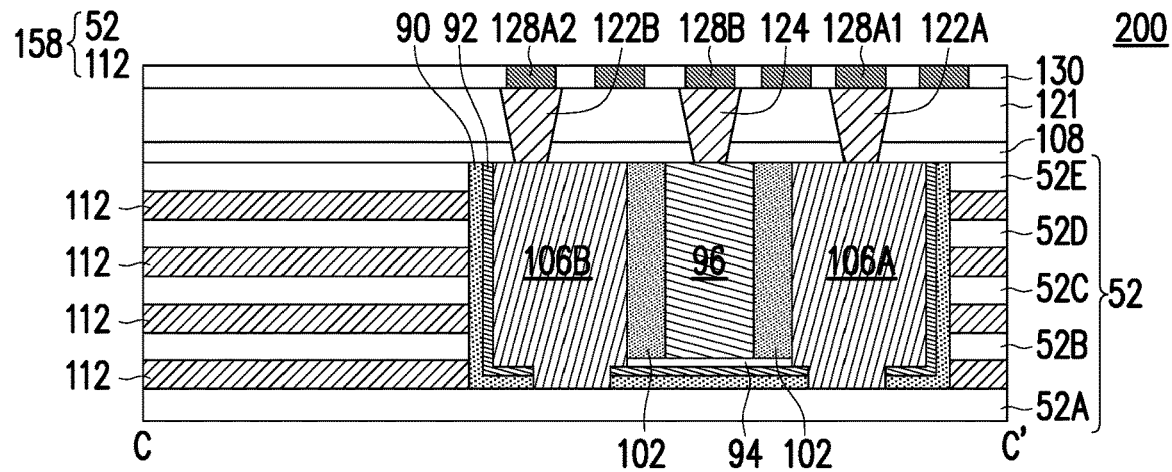
Figure 25D:
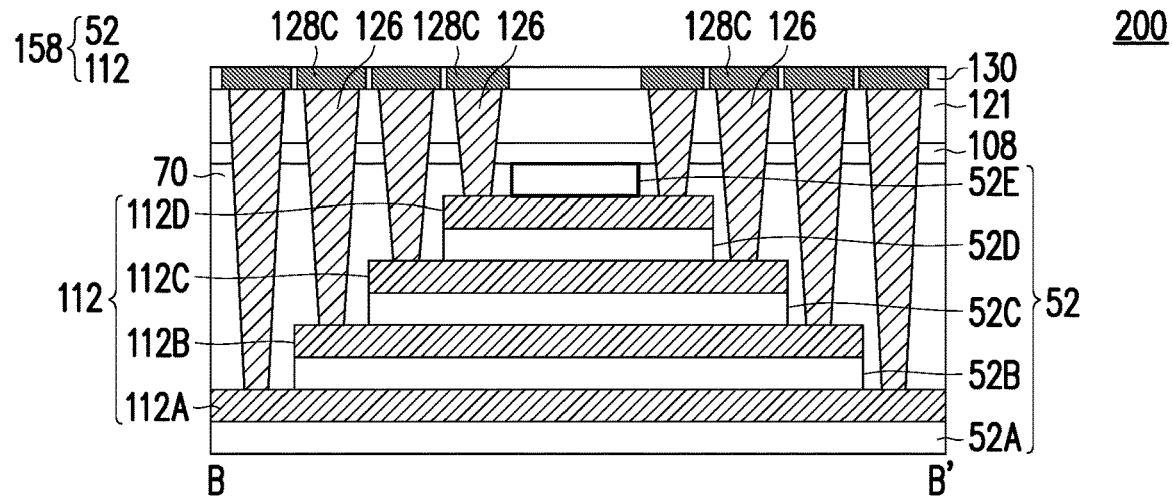
Figure 26:
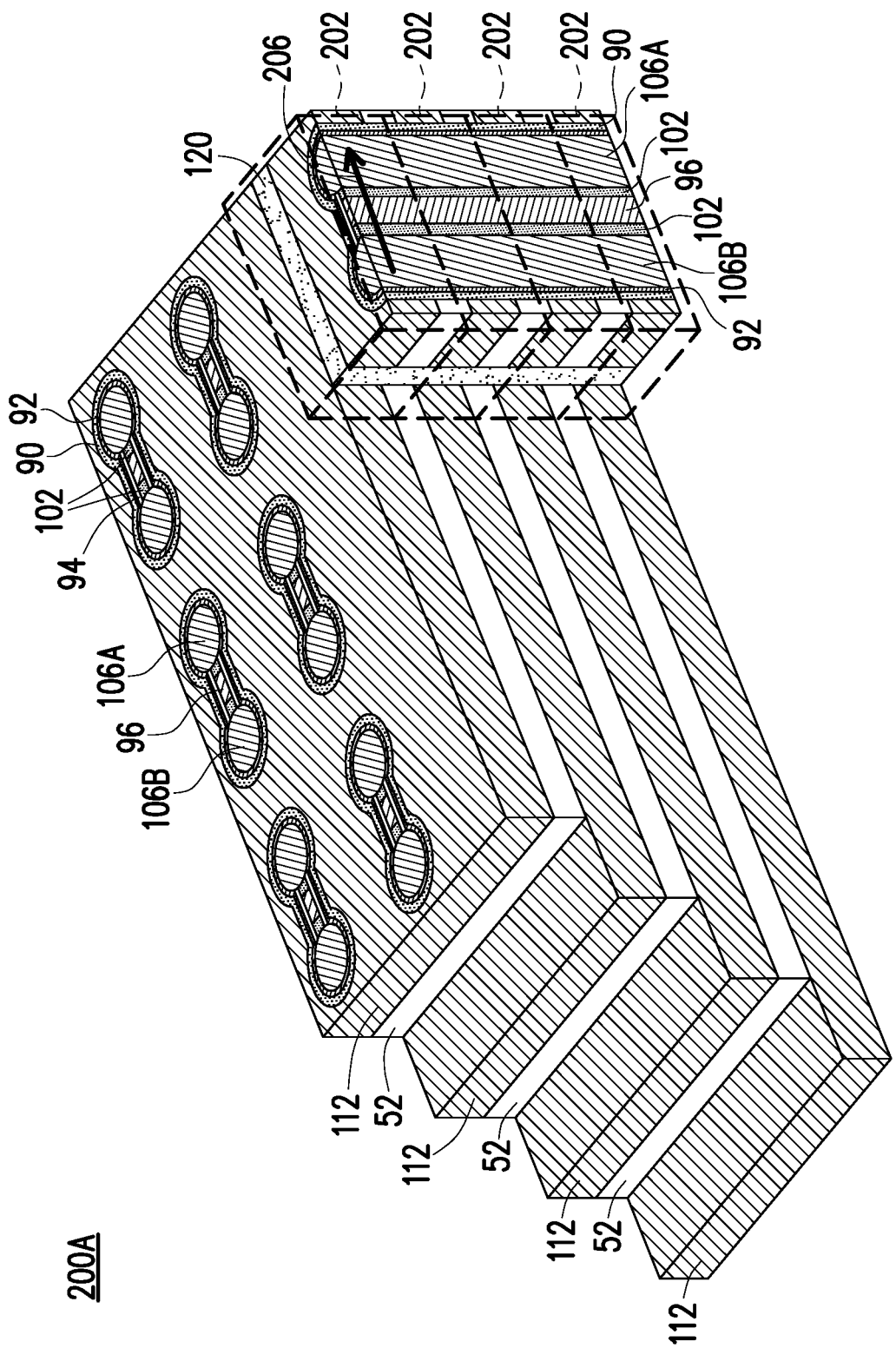
FIG. 26 illustrates a simplified perspective view of a memory device in accordance with alternative embodiments.

FIGS. 25A through 25D are views of intermediate stages in the manufacturing of an interconnect structure of the memory device 200, in accordance with some embodiments. FIG. 25A illustrate top-down views. FIG. 25B is illustrated along reference cross-section D-D' illustrated in FIG. 25A (also along reference cross-section D-D' illustrated in FIG. 1A). FIG. 25C is illustrated along reference cross-section C-C' illustrated in FIG. 25A (also along reference cross-section C-C' illustrated in FIG. 1A). FIG. 25D illustrates a cross-sectional view of the device along line B-B' of FIG. 1A.

In FIGS. 25A to 25D, an IMD layer 121 is formed on top surface of the dielectric layer 108. Conductive contacts 122A, 122B, 124 and 126 are made on the conductive pillars 106A, 106B, and the conductive pillars 96 and the conductive layers 112, respectively.

The IMD 121 may be formed of a dielectric material, and may be deposited by any suitable method, such as CVD, PECVD, flowable CVD (FCVD), or the like. The dielectric materials may include phospho-silicate glass (PSG), borosilicate glass (BSG), boron-doped phospho-silicate glass (BPSG), undoped silicate glass (USG), a low-k dielectric material or the like. In some embodiments, the IMD 121 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 121 to remove excess dielectric material over the multi-layer stack 58 and the IMD 70. In some embodiments, the removal process may be a planarization process, such as a chemical mechanical polish (CMP), an etch-back process, combinations thereof, or the like.

In FIG. 25D, in some embodiments, the staircase shape of the conductive layers 112 provides a surface on each of the conductive layers 112 for the conductive contacts 126 to land on. In some embodiments, forming the conductive contacts 126 may include patterning openings in the IMD 121 and IMD 70 to expose portions of the conductive layers 112 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 121. The remaining liner and conductive material form the conductive contacts 126 in the openings.

In FIG. 25A through 25C, conductive contacts 122A, 122B and 124 may also be made on the conductive pillars 106A, 106B and 96, respectively. The conductive contacts 122A, 122B, 124 and 126 may be electrically connected to conductive lines 128A1, 128A2, 128B and 128C, respectively, which connect the memory array to an underlying/overlying circuitry (e.g., control circuitry) and/or signal, power, and ground lines in the semiconductor die. For example, as shown in FIG. 25D, the conductive contacts 126 extend through the IMD 121, the dielectric layer 108 and IMD 70 to electrically connect conductive lines 128C to the conductive layers 112. Other conductive contacts or vias may be formed through the IMD 121 to electrically connect the conductive lines 128A1, 128A2, 128B and 128C to the underlying active devices one the substrate. The conductive lines 128A1, 128A2, 128B and 128C may be formed in an IMD 130. The IMD 130 may be similar to the IMD 121. In alternative embodiments, routing and/or power lines to and from the memory array may be provided by an interconnect structure formed over the memory device 200 in addition to or in lieu of the interconnect structure 320. Accordingly, the memory device 200 may be completed.

In some embodiments, a conductive pillar (i.e., the conductive pillar 96) as an assist gate is disposed between two conductive pillars (i.e., the conductive pillars 106A, 106B) electrically connected to a bit line and a source line. In this configuration, by changing the source line/bit line voltage, the trapped charge may be addressed to 2 bits in one memory cell. That is, the memory cell 202 is operated as a 2-bits memory cell, for example. Thus, the operation speed of the memory cell is faster, and the device performance is accordingly improved.

The assist gates 96 can help control the surface potential of the channel layer 92 (particularly the portions of the channel layer 92 distal the word lines 112) during write operations. For example, the work function of the material (e.g., tungsten) of the assist gates 96 can help reduce the surface potential of the channel layer 92. The window for write operations may thus be widened. Further, during a write operation, a biasing voltage can be applied to an assist gate 96 thereby increasing the write voltage applied across a corresponding gate dielectric layer 94 during the write operation. The performance of the memory device 200 may thus be improved.

Although the embodiments of FIGS. 1A through 25C illustrate a particular pattern for the conductive pillars 106A, 106B and 96, other configurations are also possible. For example, in these embodiments, the conductive pillars 106A, 106B and 96 have a staggered pattern. However, in other embodiments, the conductive pillars 106A, 106B and 96 in a same row of the array are all aligned with each other, as shown in the memory device 200A of FIG. 26.

In some embodiments, the shape of the conductive pillars 100B is similar to or the same as that of the conductive pillar 106A, and the shapes of the conductive pillars 96 and the dielectric pillars 102 are different from the shapes of the conductive pillars 106A and 106B. However, the disclosure is not limited thereto. In alternative embodiments, as shown in a memory device 200B of FIGS. 27, the shape of the conductive pillars 96 is similar to that of the conductive pillars 106A and 106B, and different from dielectric pillars 102. The conductive pillars 96, 106A and 106B are arranged to form a circular-like shape, an oval-like shape, or a polygon-like shape from a top view, and the dielectric pillars 102 are arranged to form a rectangular-like shape from a top view. Though the shape of the conductive pillars 96 is similar to that of the conductive pillars 106A and 106B, the conductive pillars 96 is narrow than the conductive pillars 106A and 106B, and border than the dielectric pillars 102. In other words, the conductive pillar 96 has a third width $W_C'$ less than a first width $W_A'$ of the conductive pillar 106A and a second width $W_B'$ of the conductive pillars 106B, and greater than a fourth width $W_D'$ of the dielectric pillars 102. The memory device 200B may be formed by a method similar to that of the memory device 200, and detail are not repeated herein again. For example, the first width $W_A'$ and the second width $W_B'$ is greater than the third width $W_C'$ by at least 3 nm or more, and greater than the fourth width $W_D'$ by at least 20 nm or more.

The assist gate 96 can help control the surface potential of the channel layer 92 (particularly the portions of the channel layer 92 distal the conductive layer 112) during write operations. For example, the work function of the material (e.g., tungsten) of the assist gate 96 can help reduce the surface potential of the channel layer 92. The window for write operations may thus be widened. Further, during a write operation, a biasing voltage can be applied to an assist gate 96, thereby increasing the write voltage applied across a corresponding memory material layer 90 during the write operation. The performance of the memory array may thus be improved.

Figure 28:
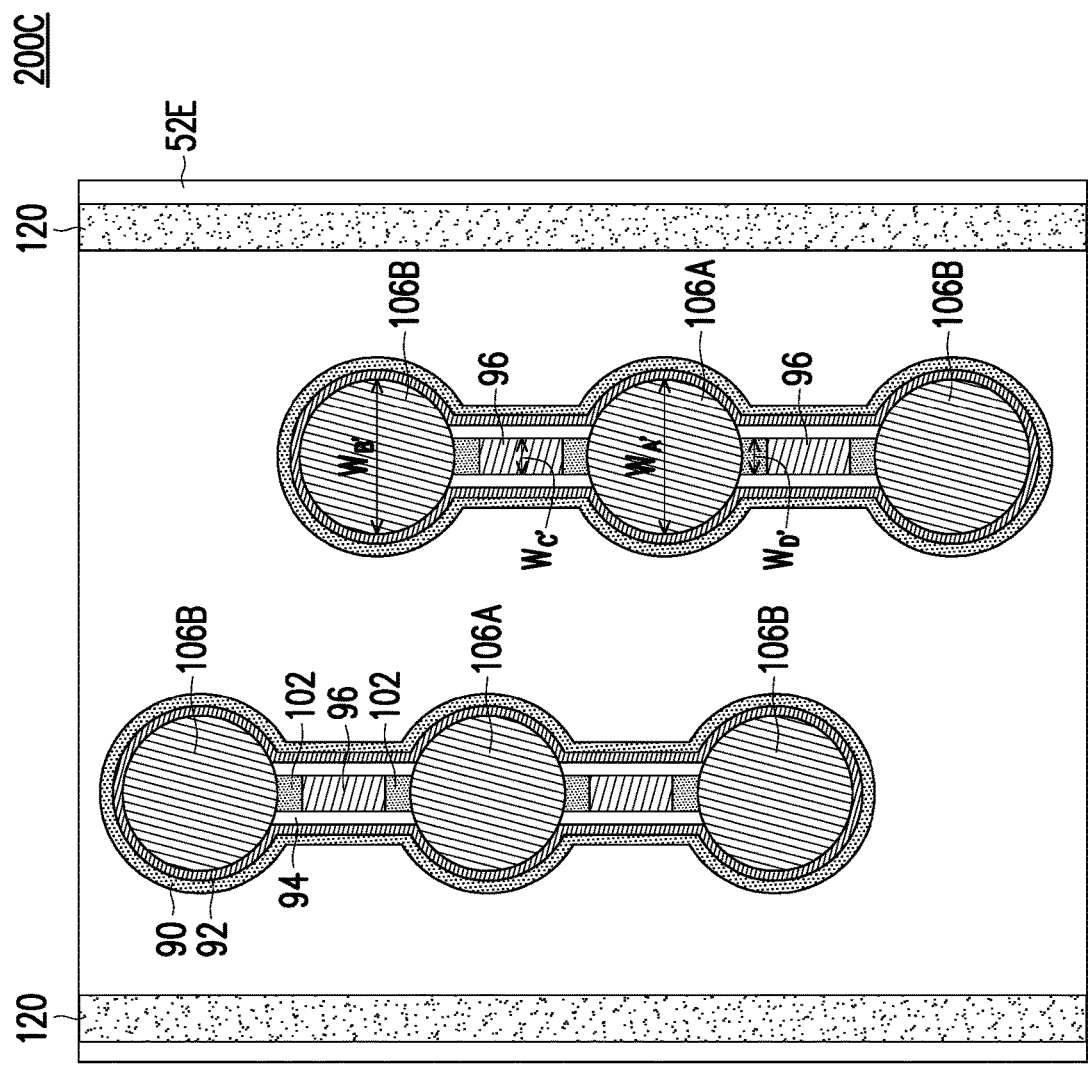
FIG. 28 illustrates a top down view of a memory cell of a memory device in accordance with alternative embodiments.

In FIG. 28, in some embodiments, a memory device 200C includes conductive pillar 106A electrically connected to common source lines. The conductive pillar 106A is disposed between conductive pillars 106B electrically connected to bit lines. Each conductive pillar 96 as an assist gate is disposed the conductive pillar 106A and one of the conductive pillars 106B. The memory cells in a same horizontal row of the memory device 200C may share a common word line while the memory cells 202 in a same vertical column of the memory device 200 may share a common source line and common bit lines.

In some embodiments, the shape of the conductive pillars 100B is similar to or the same as that of the conductive pillar 106A. The shape of the conductive pillar 96 is different from the shapes of the conductive pillars 100A and 100B. The shape of the dielectric pillars 102 are different from the shapes of the conductive pillars 100A and 100B. In some embodiments, the conductive pillars 106A and 106B are arranged to form a circular-like shape, an oval-like shape, or a polygon-like shape from a top view, and the conductive pillars 96 and the dielectric pillars 102 are respectively arranged to form a rectangular-like shape from a top view. The conductive pillars 96 and the dielectric pillars 102 are narrow than the conductive pillars 106A and 106B. In other words, the conductive pillar 96 has a third width $W_C'$ less than a first width $W_A'$ of the conductive pillar 106A and a second width $W_B'$ of the conductive pillars 106B. A fourth width $W_D'$ of the dielectric pillar 102 is closer to the third width $W_C'$ than the first width $W_A'$ and the second width $W_B'$. In some embodiments, the fourth width $W_D'$ is substantially equal to the third width $W_C'$. For example, the first width $W_A'$ and the second width $W_B'$ is greater than the third width $W_C'$ and the fourth width $W_D'$ by at least 20 nm or more.

The memory device 200C may be formed by a method similar to that of the memory device 200, and detail are not repeated herein again.

In this configuration, by changing the source line/bit line voltage, the trapped charge may be addressed to 4 bits in one memory cell. That is, the memory cell 202 is operated as a 4-bits memory cell, for example. Thus, the operation speed of the memory cell is faster, and the device performance is accordingly improved.

The assist gate 96 can help control the surface potential of the channel layer 92 (particularly the portions of the channel layer 92 distal the conductive layer 112) during write operations. For example, the work function of the material (e.g., tungsten) of the assist gate 96 can help reduce the surface potential of the channel layer 92. The window for write operations may thus be widened. Further, during a write operation, a biasing voltage can be applied to an assist gate 96, thereby increasing the write voltage applied across a corresponding memory material layer 90 during the write operation. The performance of the memory array may thus be improved.

Figure 29:
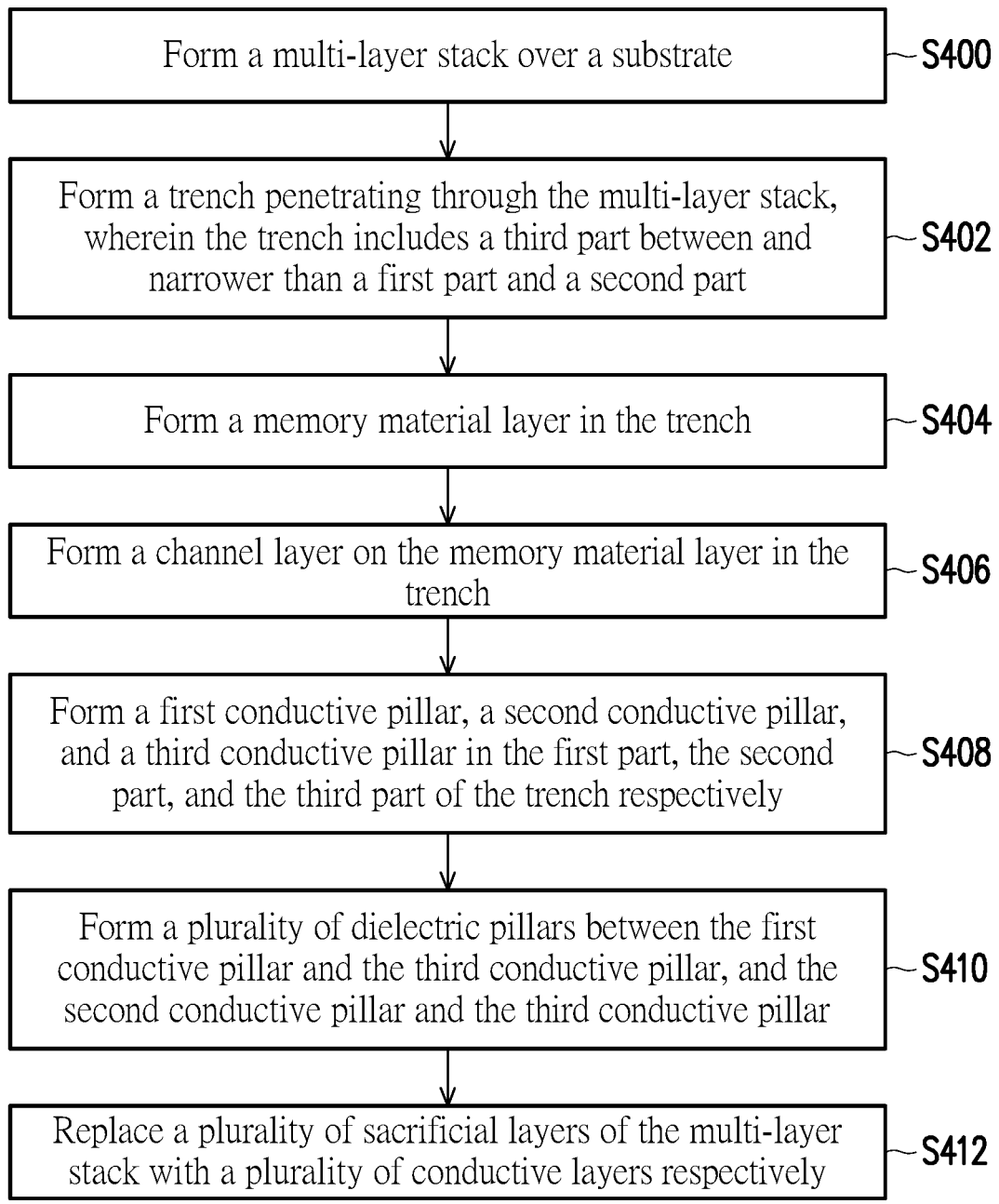
FIG. 29 illustrates a method of forming a memory device in accordance with some embodiments.

FIG. 29 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S400, a multi-layer stack is formed on a substrate. The multi-layer stack includes a plurality of dielectric layers and a plurality of sacrificial layers stacked alternately. FIG. 3 to FIG. 12 illustrate varying views corresponding to some embodiments of act S400.

At act S402, a trench is formed penetrating through the multi-layer stack. The trench comprises a first part, a second part and a third part, and the third part is between and narrower than the first part and the second part. FIG. 13A to FIG. 13C illustrate varying views corresponding to some embodiments of act S402.

At act S404, a memory material layer is formed in the trench. FIG. 14A to FIG. 15C illustrate varying views corresponding to some embodiments of act S404.

At act S406, a channel layer is formed over the memory material layer in the trench. FIG. 14A to FIG. 15C illustrate varying views corresponding to some embodiments of act S406.

At act S408, a first conductive pillar, a second conductive pillar, and a third conductive pillar are formed in a first part, a second part, and a third part of the trench respectively. FIG. 14A to FIG. 20C varying views corresponding to some embodiments of act S408.

At act S410, a plurality of dielectric pillars are formed the first conductive pillar and the third conductive pillar, and the second conductive pillar and the third conductive pillar. FIG. 17A to FIG. 18C illustrate varying views corresponding to some embodiments of act S410.

At act S412, the sacrificial layers are replaced with a plurality of conductive lines. FIG. 23A to FIG. 24C illustrate varying views corresponding to some embodiments of act S412.

In some embodiments of the disclosure, a stackable 3D non-volatile memory (NVM) architecture is formed to provide an ultra-high density, and all memory cells in the 3D array are connected in parallel. Thus, a sum-of-product operation is enabled. In some embodiments of the disclosure, the cell is formed with a common source line. For example, 2 bits or more are formed in each memory cell. In some embodiments, 2n (n is an integer larger than 1) bits is formed per cell. Thus, the operation speed of the memory cell is faster, and the device performance is accordingly improved.

In the above embodiments, the memory device is formed by a "staircase first process" in which the staircase structure is formed before the memory cells are formed. However, the disclosure is not limited thereto. In other embodiments, the memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

According to various embodiments, a three-dimensional memory array is formed of programmable thin film transistors (TFTs) having assist gates. The assist gates may be formed through a self-align process. During a write operation (e.g., an erase or programming operation) for a TFT, a biasing voltage is applied to the assist gate of the TFT, thereby increasing the write voltage applied across the memory material layer of the TFT. Therefore, the speed and accuracy of the write operation may be increased. The performance of the memory array may thus be improved.

In accordance with some embodiments of the present disclosure, a memory device includes a multi-layer stack, a channel layer, a memory material layer and at least three conductive pillars. The multi-layer stack is disposed on a substrate and includes a plurality of conductive layers and a plurality of dielectric layers stacked alternately. The channel layer penetrates through the plurality of conductive layers and the plurality of dielectric layers. The memory material layer is disposed between the channel layer and each of the plurality of conductive layers and the plurality of dielectric layers. The at least three conductive pillars are surrounded by the channel layer and the memory material layer, wherein the at least three conductive pillars are electrically connected to conductive lines respectively. The at least three conductive pillars includes a first conductive pillar, a second a conductive pillar and a third conductive pillar disposed between the first conductive pillar and the second conductive pillar. A third width of the third conductive pillar is smaller than a first width of the first conductive pillar and a second width of the second conductive pillar.

In accordance with alternative embodiments of the present disclosure, a memory device includes a multi-layer stack, a first conductive pillar, a plurality of second conductive pillars, a plurality of third conductive pillars, a plurality of dielectric pillars, a channel layer and a memory material layer. The multi-layer stack is disposed on a substrate and includes a plurality of gate electrode layers and a plurality of dielectric layers stacked alternately. The first conductive pillar penetrates through the multi-layer stack. The plurality of second conductive pillars are at different sides of the first conductive pillar. The plurality of third conductive pillars are disposed between the first conductive pillar and each of the plurality of second conductive pillars, wherein the first conductive pillar, the plurality of second conductive pillars and the plurality of third conductive pillar are alternately arranged with each other, and electrically connected to conductive lines respectively. The plurality of dielectric pillars penetrates through the multi-layer stack and disposed sidewalls of the plurality of third conductive pillars. The channel layer surrounds the first conductive pillar, the second conductive pillars and the dielectric pillars. The memory material layer is disposed between the channel layer and the multi-layer stack.

In accordance with yet alternative embodiments of the present disclosure, a method of forming a memory device includes the following steps. A multi-layer stack is formed on a substrate, wherein the multi-layer stack comprises a plurality of dielectric layers and a plurality of first sacrificial layers stacked alternately. A trench is formed penetrating through the multi-layer stack, wherein the trench comprises a first part, a second part and a third part, and the third part is between and narrower than the first part and the second part. A memory material layer and a channel layer are formed a in the trench. A first conductive pillar, a second conductive pillar, and a third conductive pillar are formed in the first part, the second part, and the third part of the trench respectively. A plurality of dielectric pillars are formed between the first conductive pillar and the third conductive pillar, and the second conductive pillar and the third conductive pillar. The plurality of sacrificial layers are replaced with a plurality of conductive layers respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a multi-layer stack, disposed on a substrate and comprising a plurality of conductive layers and a plurality of dielectric layers stacked alternately;
a channel layer, penetrating through the plurality of conductive layers and the plurality of dielectric layers;
a memory material layer, disposed between the channel layer and each of the plurality of conductive layers and the plurality of dielectric layers; and
at least three conductive pillars, surrounded by the channel layer and the memory material layer, wherein the at least three conductive pillars comprise:
a first conductive pillar;
a second conductive pillar; and
a third conductive pillar disposed between the first conductive pillar and the second conductive pillar,
wherein a third width of the third conductive pillar is smaller than a first width of the first conductive pillar and a second width of the second conductive pillar.

2. The memory device of claim 1, wherein the first conductive pillar is electrically connected to a source line, the second conductive pillar is electrically connected to a bit line, and the third conductive pillar is an assist gate.

3. The memory device of claim 2, further comprising a plurality of gate dielectric layers, wherein each of plurality of gate dielectric layers is disposed between the assist gate and the channel layer.

4. The memory device of claim 2, further comprising a dielectric material between each adjacent two of the at least three conductive pillars.

5. The memory device of claim 4, wherein the plurality of gate dielectric layers further disposed between the dielectric material and the channel layer.

6. The memory device of claim 4, wherein the dielectric material has a fourth width less than the first width and the second width.

7. The memory device of claim 6, wherein top views of the first and second conductive pillars are circular-shaped respectively, and a top view of the third conductive pillar is rectangular-shaped.

8. The memory device of claim 7, wherein the fourth width of the dielectric material is closer to the third width of the third conductive pillar than the first width of the first conductive pillar and the second width of the second conductive pillar.

9. The memory device of claim 6, wherein top views of the first, second and third conductive pillars are circular-shaped, oval shaped, or polygon shaped respectively.

10. The memory device of claim 9, wherein the fourth width of the dielectric material is less than the third width of the third conductive pillar.

11. The memory device of claim 1, wherein the channel layer and the memory material layer continuously surround outer sidewall of the at least three conductive pillars.

12. A memory device, comprising:
a multi-layer stack, disposed on a substrate and comprising a plurality of gate electrode layers and a plurality of dielectric layers stacked alternately;
a first conductive pillar, penetrating through the multi-layer stack;
a plurality of second conductive pillars, at different sides of the first conductive pillar,
a plurality of third conductive pillars, disposed between the first conductive pillar and each of the plurality of second conductive pillars, wherein the first conductive pillar, the plurality of second conductive pillars and the plurality of third conductive pillars are alternately arranged with each other;
a plurality of dielectric pillars, penetrating through the multi-layer stack and disposed on sidewalls of the plurality of third conductive pillars;
a channel layer, surrounding the first conductive pillar, the second conductive pillars and the plurality of dielectric pillars; and
a memory material layer, disposed between the channel layer and the multi-layer stack.

13. The memory device of claim 12, wherein the first conductive pillar is electrically connected to a source line, the plurality of second conductive pillars are electrically connected to bit lines respectively, and the plurality of third conductive pillars are assist gates.

14. The memory device of claim 13, further comprising a plurality of gate dielectric layers, wherein each of plurality of gate dielectric layers is disposed between each of the plurality of assist gates and the channel layer.

15. The memory device of claim 12, wherein top views of the channel layer and the memory material layer are ring-shaped.

16. The memory device of claim 12, wherein third widths of the plurality of third conductive pillars are smaller than a first width of the first conductive pillar and second widths of the plurality of second conductive pillars.

17. A memory device, comprising:
a multi-layer stack, disposed on a substrate and comprising a plurality of dielectric layers and a plurality of conductive layers stacked alternately;
a first conductive pillar and a second conductive pillar formed extending through the multi-layer stack;
an assist gate formed between the first conductive pillar and the second conductive pillar;
a dielectric pillar disposed between adjacent ones of the first conductive pillar, the second conductive pillar and the assist gate;
a channel layer surrounding the dielectric pillar, the first conductive pillar, the second conductive pillar and the assist gate; and
a memory material layer disposed between the channel layer and the plurality of dielectric layers and between the channel layer and the plurality of conductive layers.

18. The memory device of claim 17, further comprising a gate dielectric layer disposed over outer sidewall surfaces of the assist gate, and the dielectric pillar disposed at opposite sides of the assist gate.

19. The memory device of claim 17, wherein the conductive layers extend along a first direction respectively, and a first width of the assist gate is different from a second width of the dielectric pillar, a third width of the first conductive pillar, and a fourth width of the second conductive pillar along a second direction perpendicular to the first direction.

20. The memory device of claim 17, wherein the assist gate comprises a conductive material, selected from the group consisting of Ru, Cu, Al, W, Pt, Au, TiN, polysilicon, and a combination thereof.

* * * * *